US009437265B2

(12) United States Patent
Iwasa et al.

(10) Patent No.: US 9,437,265 B2
(45) Date of Patent: Sep. 6, 2016

(54) SEMICONDUCTOR DEVICE HAVING SHALLOW TRENCH ISOLATION AND GATE GROOVE

(71) Applicant: Micron Technology, Inc., Boise, ID (US)

(72) Inventors: Shinya Iwasa, Tokyo (JP); Migaku Kobayashi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 14/461,705

(22) Filed: Aug. 18, 2014

(65) Prior Publication Data

US 2015/0055394 A1   Feb. 26, 2015

(30) Foreign Application Priority Data

Aug. 26, 2013   (JP) .................. 2013-174288

(51) Int. Cl.
| | | |
|---|---|---|
| G11C 5/06 | (2006.01) | |
| G11C 8/14 | (2006.01) | |
| H01L 29/423 | (2006.01) | |
| G11C 11/408 | (2006.01) | |
| H01L 27/02 | (2006.01) | |
| H01L 27/108 | (2006.01) | |
| G11C 5/02 | (2006.01) | |
| H01L 29/417 | (2006.01) | |

(52) U.S. Cl.
CPC ............... G11C 8/14 (2013.01); G11C 5/025 (2013.01); G11C 5/063 (2013.01); G11C 11/4085 (2013.01); H01L 27/0207 (2013.01); H01L 27/10897 (2013.01); H01L 29/41766 (2013.01); H01L 29/4236 (2013.01); H01L 29/4238 (2013.01)

(58) Field of Classification Search
CPC ......... G11C 8/14; G11C 5/025; G11C 5/063; G11C 11/4085; H01L 27/0207; H01L 27/10897; H01L 29/4238; H01L 29/4236
USPC .......................................................... 365/72
See application file for complete search history.

(56) References Cited

U.S. PATENT DOCUMENTS

| | | | | |
|---|---|---|---|---|
| 7,583,550 | B2 * | 9/2009 | Ohgami | G11C 11/4091 365/205 |
| 7,768,855 | B2 * | 8/2010 | Ohgami | G11C 11/4091 365/203 |
| 8,779,432 | B2 * | 7/2014 | Yamazaki | H01L 27/0688 257/330 |
| 8,953,407 | B2 * | 2/2015 | Yun | G11C 8/08 365/230.06 |
| 9,048,130 | B2 * | 6/2015 | Yamazaki | H01L 27/0688 |
| 2008/0055958 | A1 * | 3/2008 | Takemura | G11C 11/405 365/63 |
| 2008/0165563 | A1 * | 7/2008 | Ohgami | G11C 11/4091 365/72 |
| 2009/0279372 | A1 * | 11/2009 | Ohgami | G11C 11/4091 365/208 |
| 2012/0187410 | A1 * | 7/2012 | Yamazaki | H01L 27/0688 257/66 |
| 2012/0273859 | A1 | 11/2012 | Oyu et al. | |
| 2013/0155801 | A1 * | 6/2013 | Yun | G11C 8/08 365/230.06 |

FOREIGN PATENT DOCUMENTS

| | | |
|---|---|---|
| JP | H08-236718 | 9/1996 |
| JP | 2012234964 | 11/2012 |

* cited by examiner

Primary Examiner — Richard Elms
Assistant Examiner — Xiaochun L Chen
(74) Attorney, Agent, or Firm — Wells St. John P.S.

(57) ABSTRACT

Semiconductor devices have a substrate including first and second regions of differing conductivity types and a shallow trench isolation isolation region that extends within the first and second regions. First and second active regions are disposed in respective first and second regions, with a gate electrode disposed in a lower portion of a gate groove that extends continuously from the first active region to the second active region, the gate groove being shallower than the shallow trench. A cap insulating film is disposed in an upper portion of the gate groove covering an upper surface of the gate electrode. First and second transistors are within respective first and second active regions and share the gate electrode.

22 Claims, 18 Drawing Sheets

FIG. 8
(B-B')
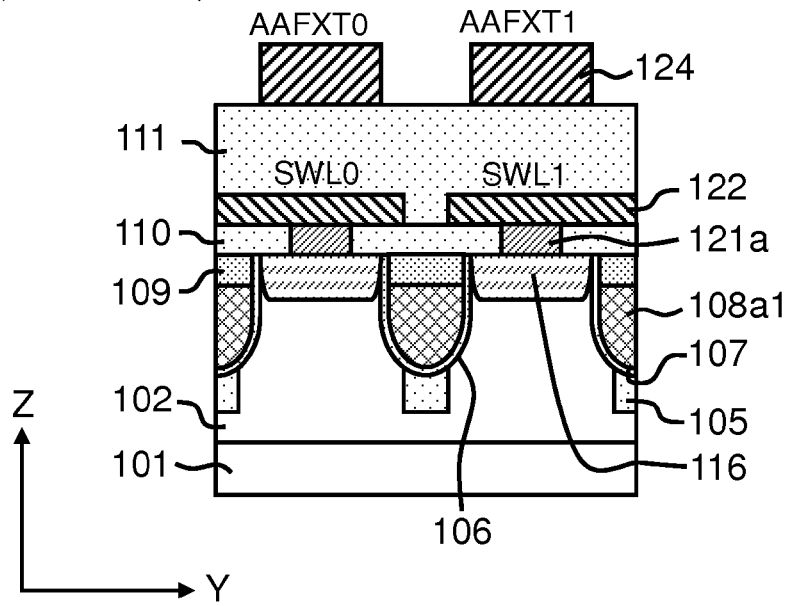
(C-C')
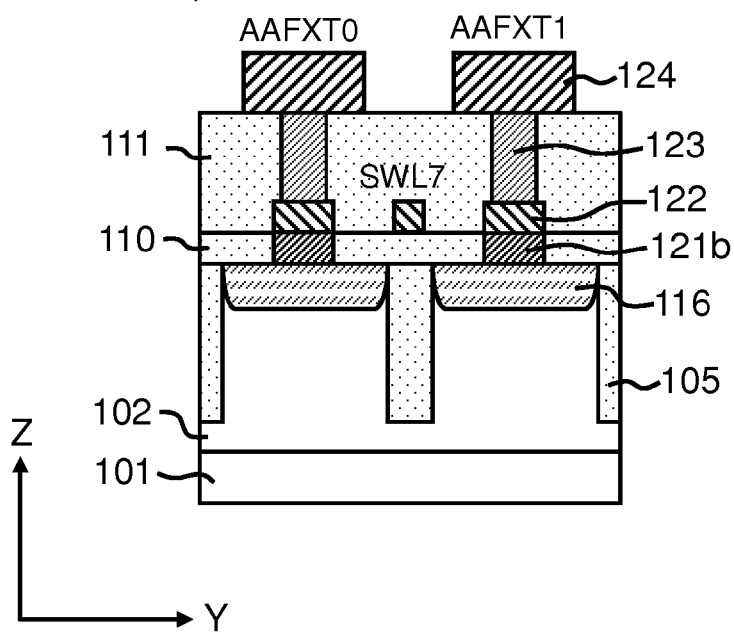

FIG. 9
(D-D')
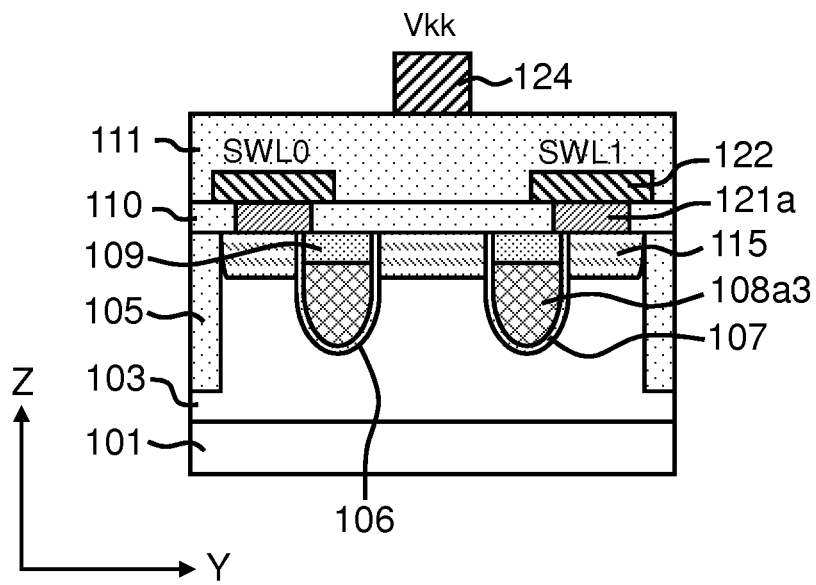
(E-E')
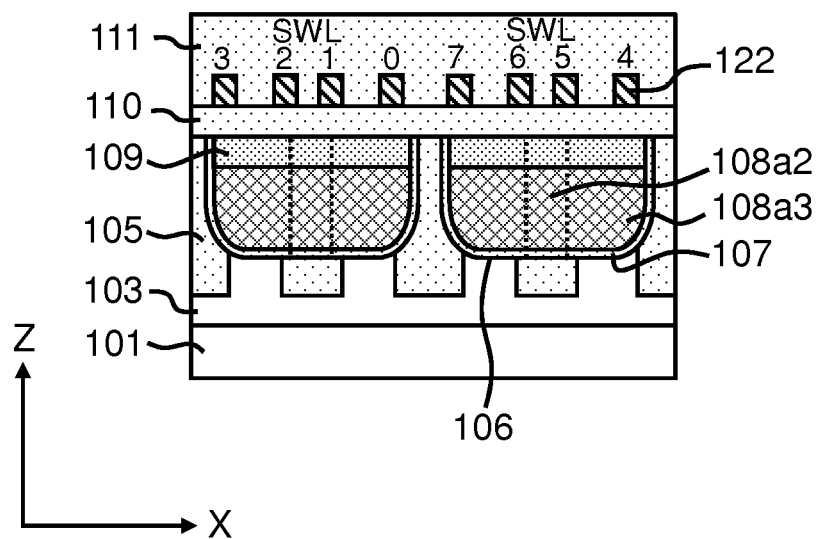

FIG. 10
(F-F´)
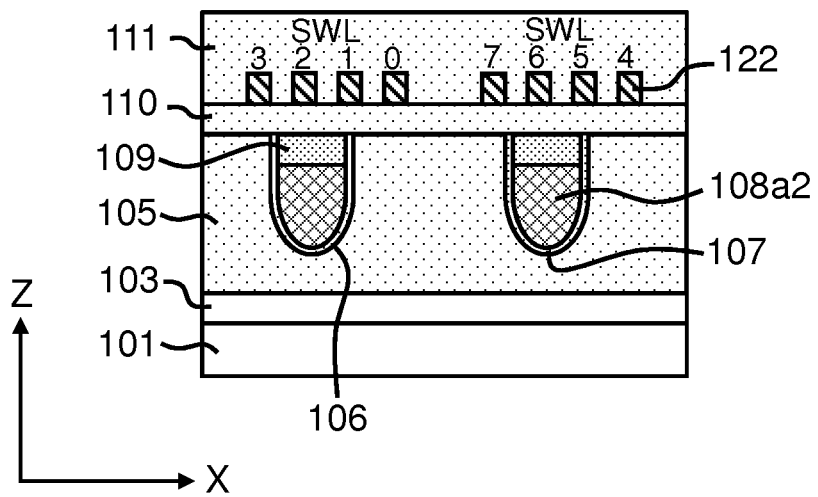
(G-G´)
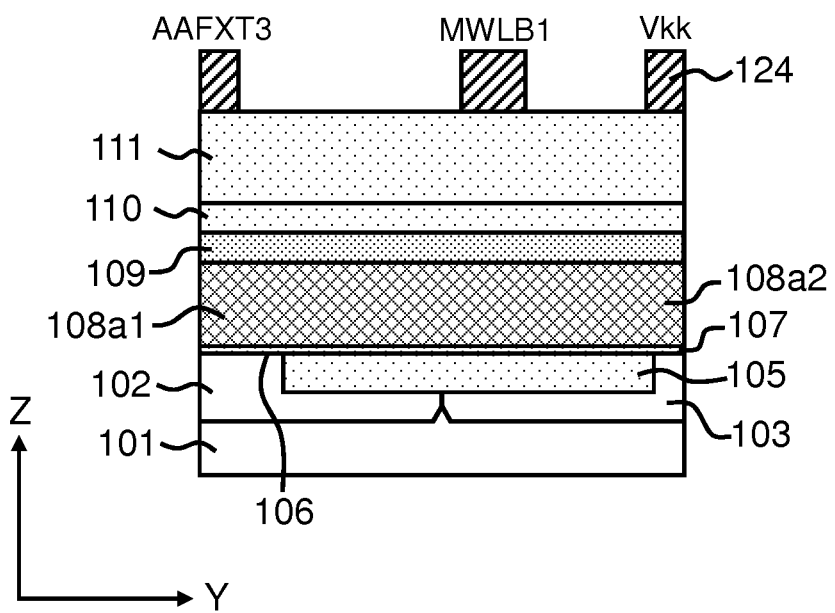

SEMICONDUCTOR DEVICE HAVING SHALLOW TRENCH ISOLATION AND GATE GROOVE

REFERENCE TO RELATED APPLICATION

This application is based upon and claims the benefit of the priority of Japanese patent application No. 2013-174288, filed on Aug. 26, 2013, the disclosure of which is incorporated herein in its entirety by reference thereto. The present invention relates to a semiconductor device.

TECHNICAL FIELD

Background of the Invention

A semiconductor device having a memory cell is configured to select a memory cell by having a word line drive circuit drive a word line. As a word line drive circuit, for instance, there is one constituted by a pMOS transistor that drives a word line selected by an address and two nMOS transistors that ground unselected word lines (refer to Patent Literature 1). As a memory cell, there is one having a selection element connected to a memory element and constituted by a trench MOS transistor as the selection element having a gate electrode (word line) buried in a groove formed on a semiconductor substrate (refer to Patent Literature 2). In such a semiconductor device, as the transistor pitch in a memory cell decreases, the transistor pitch in the word drive circuit generally tends to decrease as well.

Patent Literature 1

Japanese Patent Kokai Publication No. JP-A-H08-236718

Patent Literature 2

Japanese Patent Kokai Publication No. JP-P2012-234964A and US2012/0273859A1

SUMMARY

The following analysis is given by the present inventors.

When the pitch of transistors in a memory cell and word line drive circuit is decreased, in order to improve the transistor performance in the memory cell, a voltage Vpp can be set high. In this case, however, the intensity of the electric field in the transistors may increase, reducing the reliability against HCI (Hot Carrier Injection), and the current consumption may also increase due to an increase in the GIDL (Gate-Induced-Drain-Leakage current), impacting on the reliability of the transistors. Therefore, it is difficult to reduce the pitch of a transistor while ensuring the reliability against HCI and BTI (Bias Temperature Instability).

In order to solve the above problem, the voltage Vpp can be set low, but in this case, the transistor performance in the memory cell may decrease, reducing the yield ratio. Therefore, it is difficult to achieve both the performance and characteristics of transistors in a memory cell and word line drive circuit.

Further, when the pitch of transistors in a memory cell and word line drive circuit is decreased, abnormal contact leakage occurs more frequently due to a smaller margin that can be in contact with a gate electrode.

Further, as the standby current of DRAM (Dynamic Random Access Memory) decreases, decreasing a leakage current in a standby state such as the GIDL of word line drive circuits and abnormal contact leakage is urgently needed.

In a first aspect of the present disclosure, a semiconductor device comprises a semiconductor substrate including first and second regions that have different conductivity types from each other; an isolation region extending continuously over the first and second regions and having a shallow trench covered by a field insulator; first and second active regions placed in respective first and second regions and being each surrounded by the isolation region; a gate electrode disposed in a lower portion of a gate groove that extends continuously from the first active region to the second active region via the isolation region, the gate groove being shallower than the shallow trench; a cap insulating film disposed in an upper portion of the gate groove so as to cover an upper surface of the gate electrode; first and second transistors placed in respective first and second active regions and sharing the gate electrode; and a logic circuit including the first and second transistors connected in series.

In a second aspect of the present disclosure, a semiconductor device comprises a semiconductor substrate including first and second regions having first and second conductivity types, respectively; an isolation region extending in each of the first and second regions; first and second active regions placed in respective first and second regions and each surrounded by the isolation region; a gate electrode buried in a lower portion of a gate groove that extends continuously from the first active region to the second active region via the isolation region; and a cap insulating film buried in an upper portion of the gate groove and covering an upper surface of the gate electrode.

In a third aspect of the present disclosure, a semiconductor device comprises a semiconductor substrate including first and second regions that have different conductivity types from each other; an isolation region covered by a field insulator and extending over the first and second regions; and a conductive material disposed in a groove that extends continuously over the first and second regions, the groove disposed within the field insulator.

In a fourth aspect of the present disclosure, a semiconductor device comprises a semiconductor substrate including a first region and a second region that have different conductivity types from each other; an isolation region placed in the first region and the second region, respectively; a first active region placed in the first region and being surrounded by the isolation region; a second active region placed in the second region and being surrounded by the isolation region; a gate groove placed continuously in the first region and the second region including the first active region and the second active region and the isolation region with the gate groove being shallower than the isolation region; a first transistor placed in the first region, and having a first gate electrode disposed in a lower portion of the gate groove, with the first gate electrode overcrossing with the first active region; a second transistor placed in the second region, and having a second gate electrode disposed in a lower portion of the gate groove, with the second gate electrode overcrossing with the second active region and connected continuously to the first gate electrode; and a cap insulating film buried in an upper portion of the gate groove and covering upper surface of the first gate electrode and the second gate electrode; wherein the isolation region is also placed under the first gate electrode and the second gate electrode in a region overlapping with the first gate electrode and the second gate electrode; and wherein the first transistor and the second transistor constitute a part of a logic circuit connected in series.

In a fifth aspect of the present disclosure, a semiconductor device comprises a semiconductor substrate including a first region and a second region that have different conductivity types from each other; an isolation region placed in the first region and the second region, respectively; a first active region placed in the first region and being surrounded by the isolation region; a second active region placed in the second region and being surrounded by the isolation region; a gate groove placed continuously in the first region and the second region containing the first active region and the second active region and the isolation region; a gate electrode buried in a lower portion of the gate groove and overcrossing with the first active region and the second active region, respectively; and a cap insulating film buried in an upper portion of the gate groove and covering an upper surface of the gate electrode.

BRIEF DESCRIPTION OF THE DRAWINGS

FIG. 8 shows cross sectional views taken along lines B-B' and C-C' in FIGS. 4 and 5 schematically showing an example of the configuration of the sub-word line drivers of the peripheral circuits in the semiconductor device relating to Exemplary Embodiment 1.

FIG. 9 shows cross sectional views taken along lines D-D' and E-E' in FIGS. 4 and 5 schematically showing an example of the configuration of the sub-word line drivers of the peripheral circuits in the semiconductor device relating to Exemplary Embodiment 1.

FIG. 10 shows cross sectional views taken along lines F-F' and G-G' in FIGS. 4 and 5 schematically showing an example of the configuration of the sub-word line drivers of the peripheral circuits in the semiconductor device relating to Exemplary Embodiment 1.

PREFERRED MODES

Figure 1:
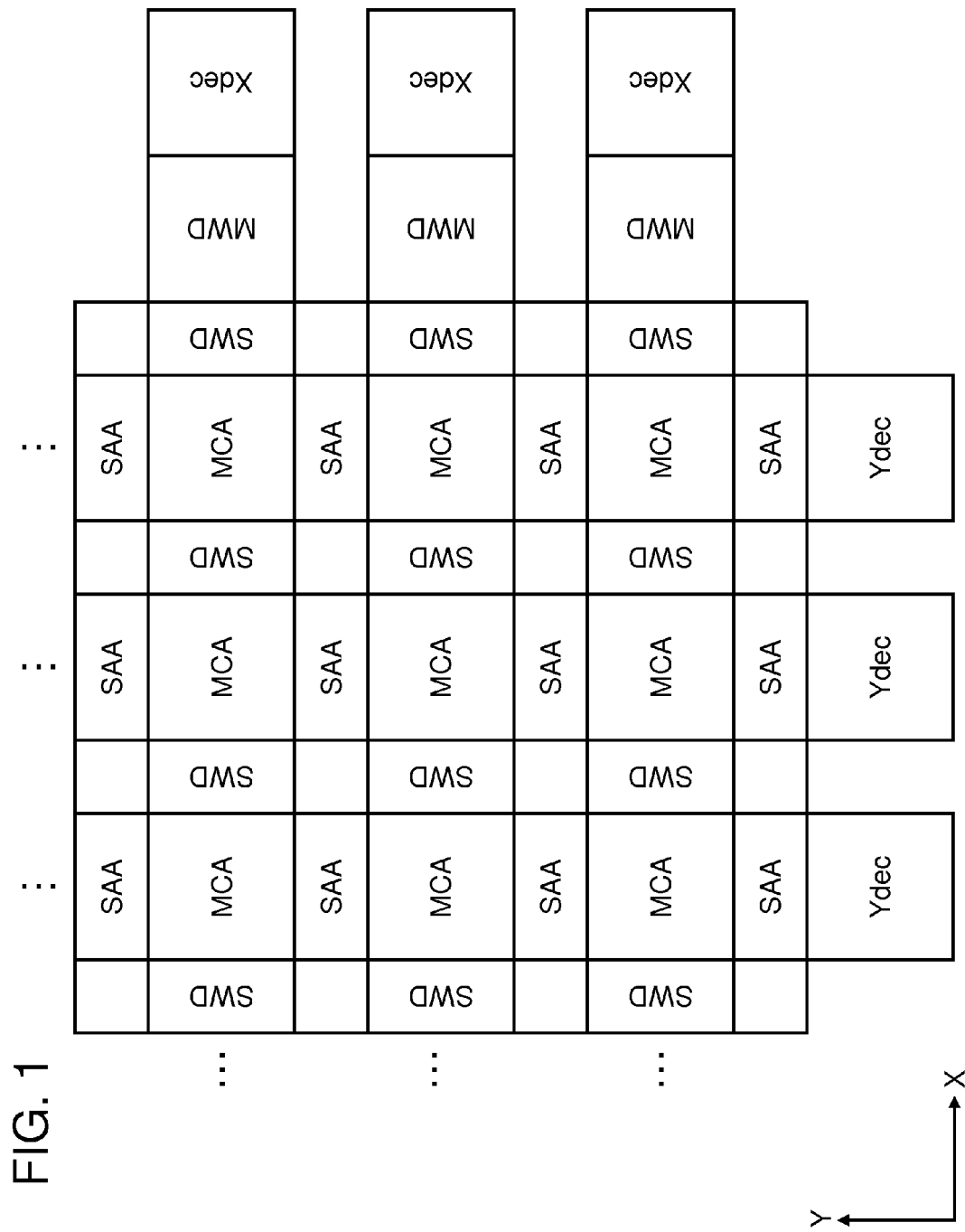
FIG. 1 is a drawing schematically showing an example of an arrangement of a part of memory cell arrays and peripheral circuits in a semiconductor device relating to Exemplary Embodiment 1.

Note that drawing reference signs in the present disclosure are given solely for facilitating understanding and are not intended to limit the present invention to the exemplary embodiments shown in the drawings.

[Exemplary Embodiment 1]

Figure 2:
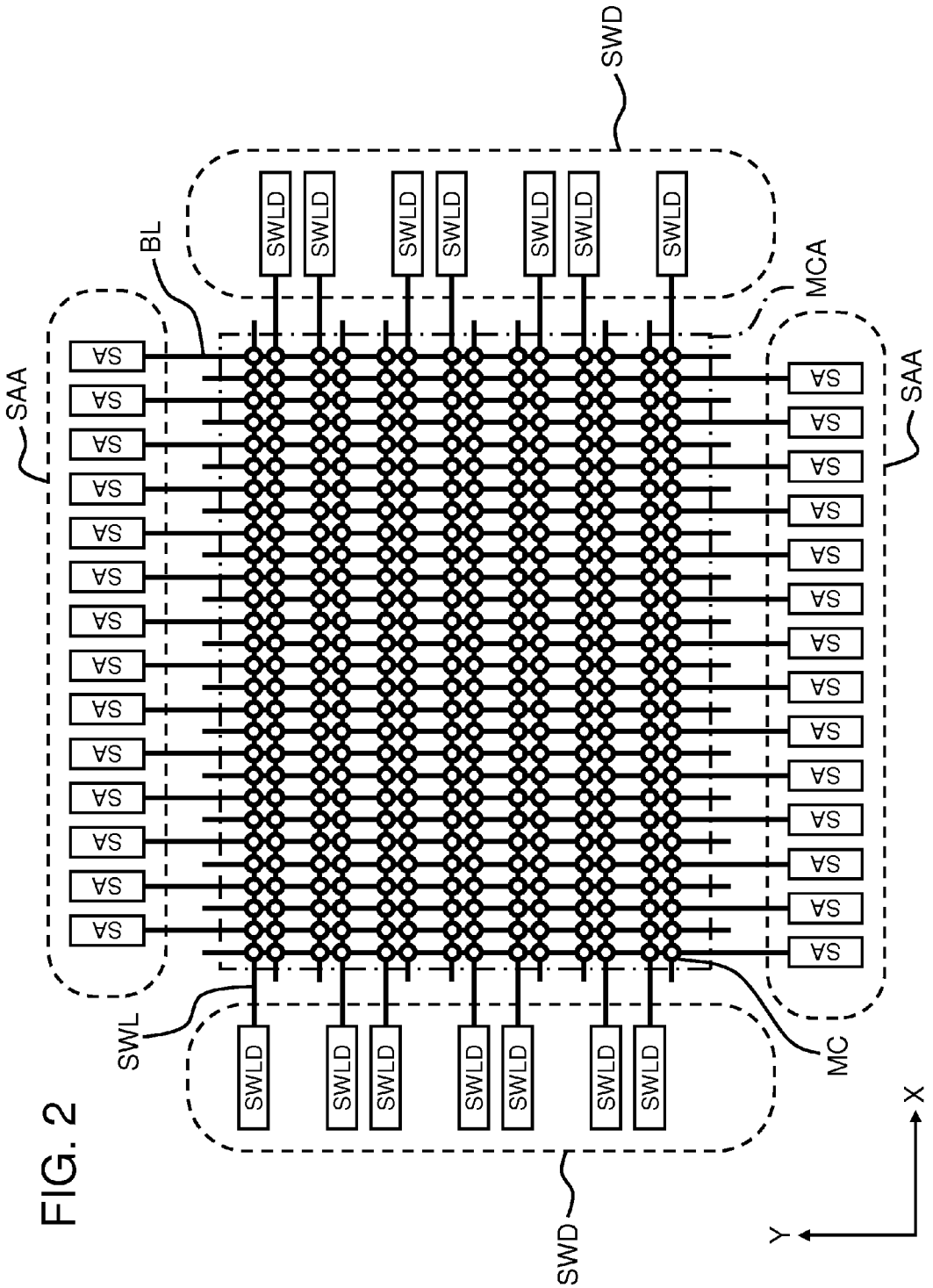
FIG. 2 is a drawing schematically showing an example of an arrangement of bit lines and word lines of the memory cell array in the semiconductor device relating to Exemplary Embodiment 1.

A semiconductor device relating to Exemplary Embodiment 1 will be described with reference to the drawings of the present disclosure. FIG. 1 is a drawing schematically showing an example of an arrangement of a part of memory cell arrays and peripheral circuits in the semiconductor device relating to Exemplary Embodiment 1. FIG. 2 is a drawing schematically showing an example of an arrangement of bit lines and word lines of the memory cell array in the semiconductor device relating to Exemplary Embodiment 1.

The semiconductor device relating to Exemplary Embodiment 1 is a semiconductor memory device (semiconductor memory) capable of storing information in a circuit constituted by a semiconductor element and may be for instance a semiconductor memory device having a DRAM (Dynamic Random Access Memory) that comprises and employs a trench MOS transistor. The semiconductor device comprises a memory cell array MCA, and as peripheral circuits of the memory cell array MCA, a row decoder Xdec, a main word driver MWD, a sub-word driver SWD, a column decoder Ydec, and a sense amplifier array SAA (refer to FIG. 1).

The memory cell array MCA is an array in which memory cells MC are arranged in a plurality of rows and columns in a matrix form (refer to FIGS. 1 and 2). The memory cell arrays MCA are also arranged in a plurality of rows and columns in a matrix form. The memory cell array MCA comprises a memory cell MC, a sub-word line SWL, and a bit line BL.

The memory cell MC is a cell constituting a circuit required to store one bit of information (refer to FIG. 2). The memory cell MC is provided at each intersection (or near each intersection) of the sub-word line SWL and the bit line BL. For instance, as the memory cell MC, one having a selection element (not showing in the drawings; a transistor) and a memory element (not shown in the drawings; a capacitor, resistance variable element) electrically connected in series between a common source line (not shown in the drawings) and the bit line BL and a gate electrode of the selection element electrically connected to the sub-word line SWL can be used. The memory cell MC is electrically connected to the corresponding sub-word line SWL and bit line BL. Further, the common source line provides a common reference potential to each memory cell MC.

The sub-word lines SWL extend in an X direction and are arranged side by side in a Y direction (refer to FIG. 2). Each sub-word line SWL is electrically connected to a corresponding sub-word line driver SWLD in one of the sub-word drivers SWD provided on both sides of the memory cell array MCA in the X direction.

The bit lines BL extend in the Y direction and are arranged side by side in the X direction (refer to FIG. 2). Each bit line BL is electrically connected to a corresponding sense amplifier SA in one of the sense amplifier arrays SAA provided on both sides of the memory cell array MCA in the Y direction.

The row decoder Xdec is a circuit that decodes a signal (encoded row address) from an array control circuit (not shown in the drawings) and a row address buffer (not shown in the drawings) (refer to FIG. 1). The row decoder Xdec outputs a decoded signal (row address) to the main word driver MWD.

The main word driver MWD is a circuit that selects a sub-word driver SWD belonging to the signal (row address) from the row decoder Xdec (refer to FIG. 1). The main word driver MWD selects the corresponding sub-driver SWD based on the signal (row address) from the row decoder Xdec, and outputs the signal (row address) to the selected sub-word driver SWD.

The sub-word driver SWD is a circuit that selects a memory cell belonging to a predetermined row in the memory cell array MCA (refer to FIGS. 1 and 2). The sub-word drivers SWD are provided on both sides of the memory cell array MCA in the X direction. The sub-word driver SWD comprises a plurality of sub-word line drivers SWLD. The sub-word line driver SWLD is electrically connected to a corresponding sub-word line SWL. Based on a row address from the main word driver MWD, the sub-word driver SWD activates a sub-word line driver SWLD corresponding to this row address, and drives (selects) a memory cell MC of the row address in the memory cell array MCA via the corresponding sub-word line SWL. Detailed configurations of the sub-word driver SWD and the sub-word line driver SWLD will be described in later.

The column decoder Ydec is a circuit that decodes a signal (encoded column address) from the array control circuit (not shown in the drawings) and a column address buffer (not shown in the drawings) (refer to FIG. 1). The column decoder Ydec activates a corresponding bit line BL based on a column address and selects a column address in the memory cell array MCA via the bit line BL.

The sense amplifier array SAA is an array in which a plurality of the sense amplifiers SA are provided (refer to FIGS. 1 and 2). The sense amplifier arrays SAA are provided on both sides of the memory cell array MCA in the Y direction. The sense amplifier SA is a circuit that amplifies the potential of data read from the memory cell array MCA via the selected bit line BL. The sense amplifier SA outputs the data whose potential has been amplified to a decision circuit (not shown in the drawings).

Figure 3:
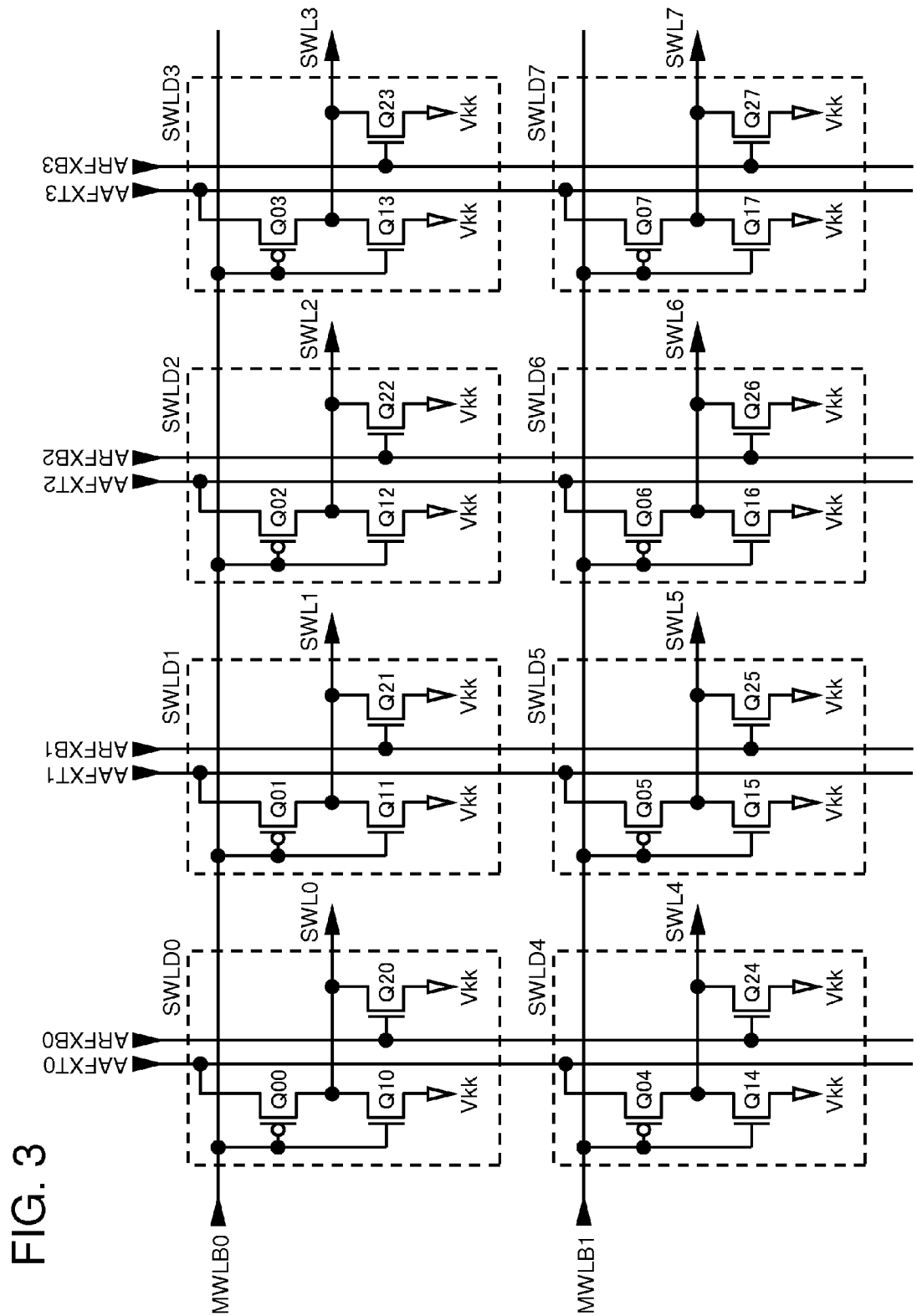
FIG. 3 is a drawing schematically showing an example of the circuit configuration of sub-word line drivers of the peripheral circuits in the semiconductor device relating to Exemplary Embodiment 1.

Next, the configurations of the sub-word driver SWD and the sub-word line driver SWLD in the semiconductor device relating to Exemplary Embodiment 1 of the present disclosure will be described with reference to the drawings. FIG. 3 is a drawing schematically showing an example of the circuit configuration of the sub-word line drivers of the peripheral circuits in the semiconductor device relating to Exemplary Embodiment 1.

In the sub-word driver SWD, a plurality of the sub-word line drivers SWLD0 to SWLD7 are arranged in a matrix form having a plurality of rows and columns.

In the sub-word line driver SWLD0, a pMOS transistor Q00 and an nMOS transistor Q10 are electrically connected in series between a sub-word line selection signal line AAFXT0 and a reference potential line Vkk (0 to −0.5 V), and the nMOS transistor Q10 and an nMOS transistor Q20 are electrically connected in parallel between the pMOS transistor Q00 and the reference potential line Vkk. An address signal line MWLB0 (row address signal line) from the main word driver MWD is electrically connected to each gate electrode of the pMOS transistor Q00 and the nMOS transistor Q10. A sub-word line non-selection signal line ARFXB0 is electrically connected to a gate electrode of the nMOS transistor 20. A sub-word line SWL0 is electrically connected to a source terminal of the pMOS transistor Q00, a drain terminal of the nMOS transistor Q10, and a drain terminal of the nMOS transistor Q20. The other sub-word line drivers SWLD1 to SWLD7 are configured identically.

Further, the address signal line MWLB0 is commonly and electrically connected to the sub-word line drivers SWLD0 to SWLD3. Similarly, the address signal line MWLB1 is commonly and electrically connected to the sub-word line drivers SWLD4 to SWLD7. Further, the sub-word line selection signal line AAFXT0 and the sub-word line non-selection signal line ARFXB0 are commonly and electrically connected to the sub-word line drivers SWLD0 and SWLD4. Similarly, a sub-word line selection signal line AAFXT1 and a sub-word line non-selection signal line ARFXB1 are commonly and electrically connected to the sub-word line drivers SWLD1 and SWLD5. Similarly, a sub-word line selection signal line AAFXT2 and a sub-word line non-selection signal line ARFXB2 are commonly and electrically connected to the sub-word line drivers SWLD2 and SWLD6. A sub-word line selection signal line AAFXT3 and a sub-word line non-selection signal line ARFXB3 are also commonly and electrically connected to the sub-word line drivers SWLD3 and SWLD7. Further, the configuration of the sub-word line drivers SWLD0 to SWLD7 will be described later.

Further, the sub-word line selection signal line AAFXT0 is a signal line that outputs a column address signal that selects the sub-word lines SWL0 and SWL4 in the same column (sets them to high active). The sub-word line selection signal line AAFXT1 is a signal line that outputs a column address signal that selects the sub-word lines SWL1 and SWL5 in the same column (sets them to high active). The sub-word line selection signal line AAFXT2 is a signal line that outputs a column address signal that selects the sub-word lines SWL2 and SWL6 in the same column (sets them to high active). The sub-word line selection signal line AAFXT3 is a signal line that outputs a column address signal that selects the sub-word lines SWL3 and SWL7 in the same column (sets them to high active).

Further, the sub-word line non-selection signal line ARFXB0 is a signal line that outputs a signal that deselects the sub-word lines SWL0 and SWL4 in the same column (sets them to low active). The sub-word line non-selection signal line ARFXB1 is a signal line that outputs a signal that deselects the sub-word lines SWL1 and SWL5 in the same column (sets them to low active). The sub-word line non-selection signal line ARFXB2 is a signal line that outputs a signal that deselects the sub-word lines SWL2 and SWL6 in the same column (sets them to low active). The sub-word line non-selection signal line ARFXB0 is a signal line that outputs a signal that deselects the sub-word lines SWL3 and SWL7 in the same column (sets them to low active). The sub-word line non-selection signal line ARFXB3 is a signal line that outputs a signal that deselects the sub-word lines SWL3 and SWL7 in the same column (sets them to low active).

Further, the reference potential line Vkk is a power supply line that provides a power supply potential that sets the sub-word lines SWL0 to SWL7 to a low level.

Further, the address signal line MWLB0 is a signal line that outputs a row address signal that selects the sub-word lines SWL0 to SWL3 in the same row. The address signal line MWLB1 is a signal line that outputs a row address signal that selects the sub-word lines SWL4 to SWL7 in the same row.

Figure 4:
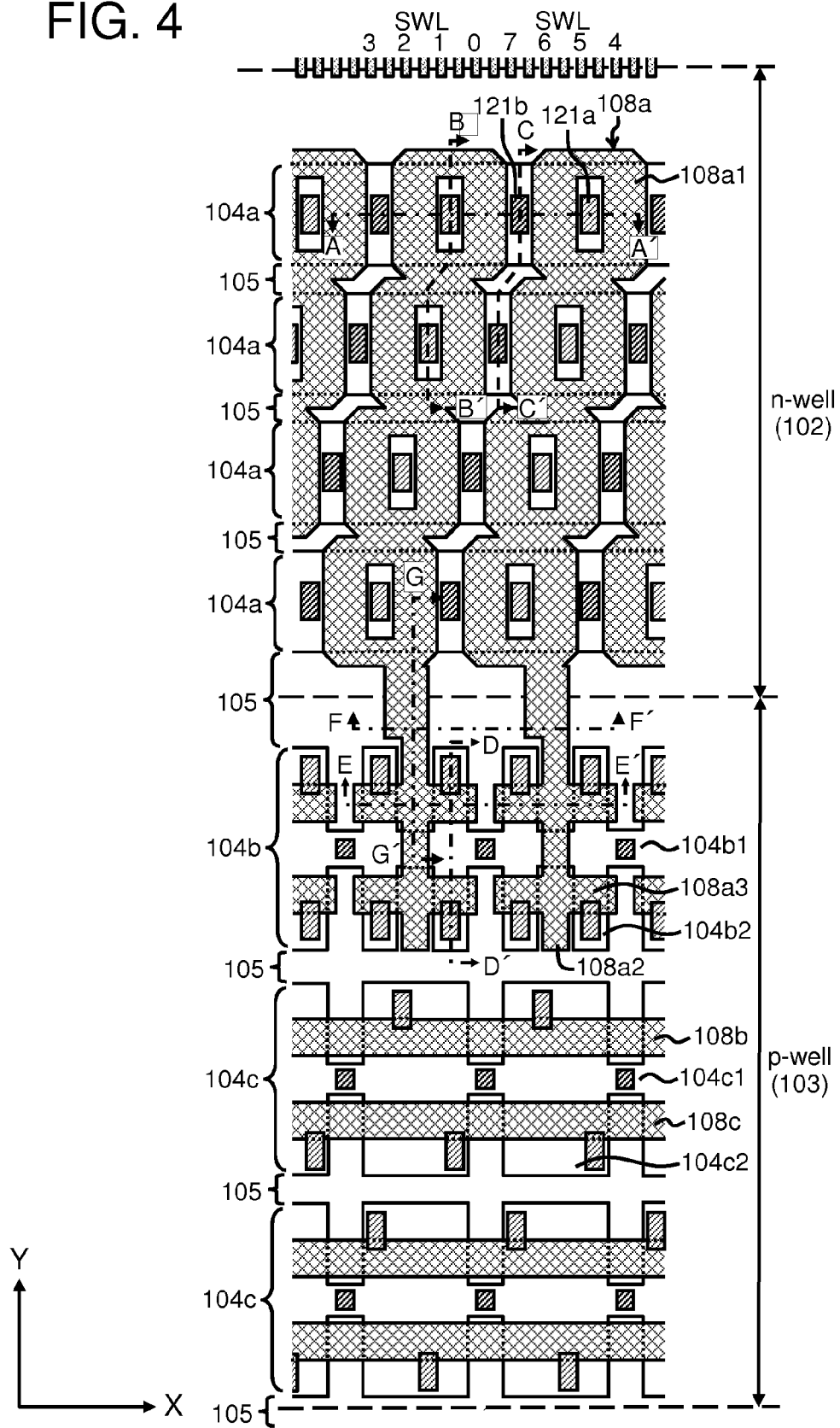
FIG. 4 is a drawing schematically showing an example of the layout of the sub-word line drivers of the peripheral circuits in the semiconductor device relating to Exemplary Embodiment 1.
Figure 5:
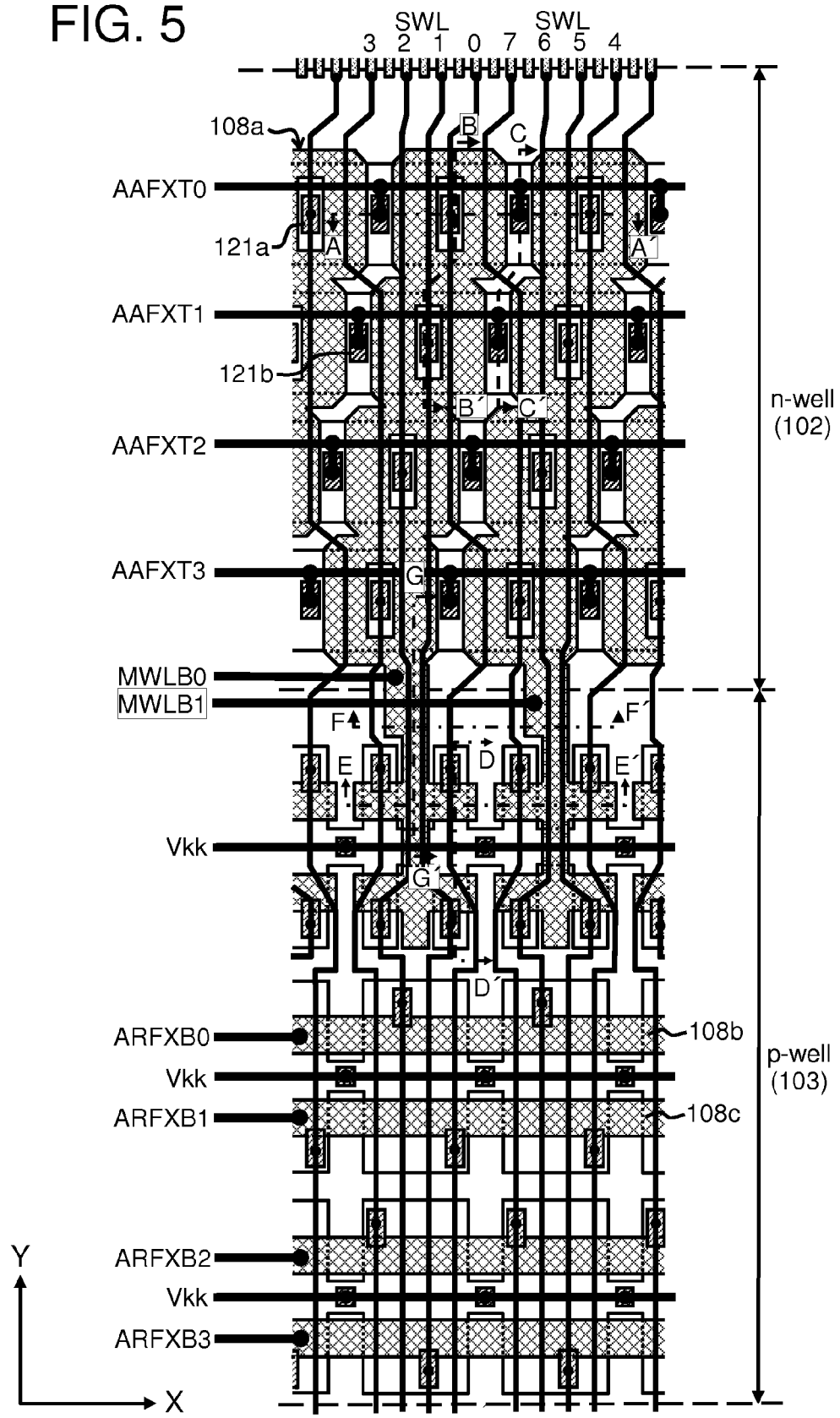
FIG. 5 is a drawing corresponding to FIG. 4 and showing an example of how the sub-word line drivers of the peripheral circuits are wired in the semiconductor device relating to Exemplary Embodiment 1.
Figure 6:
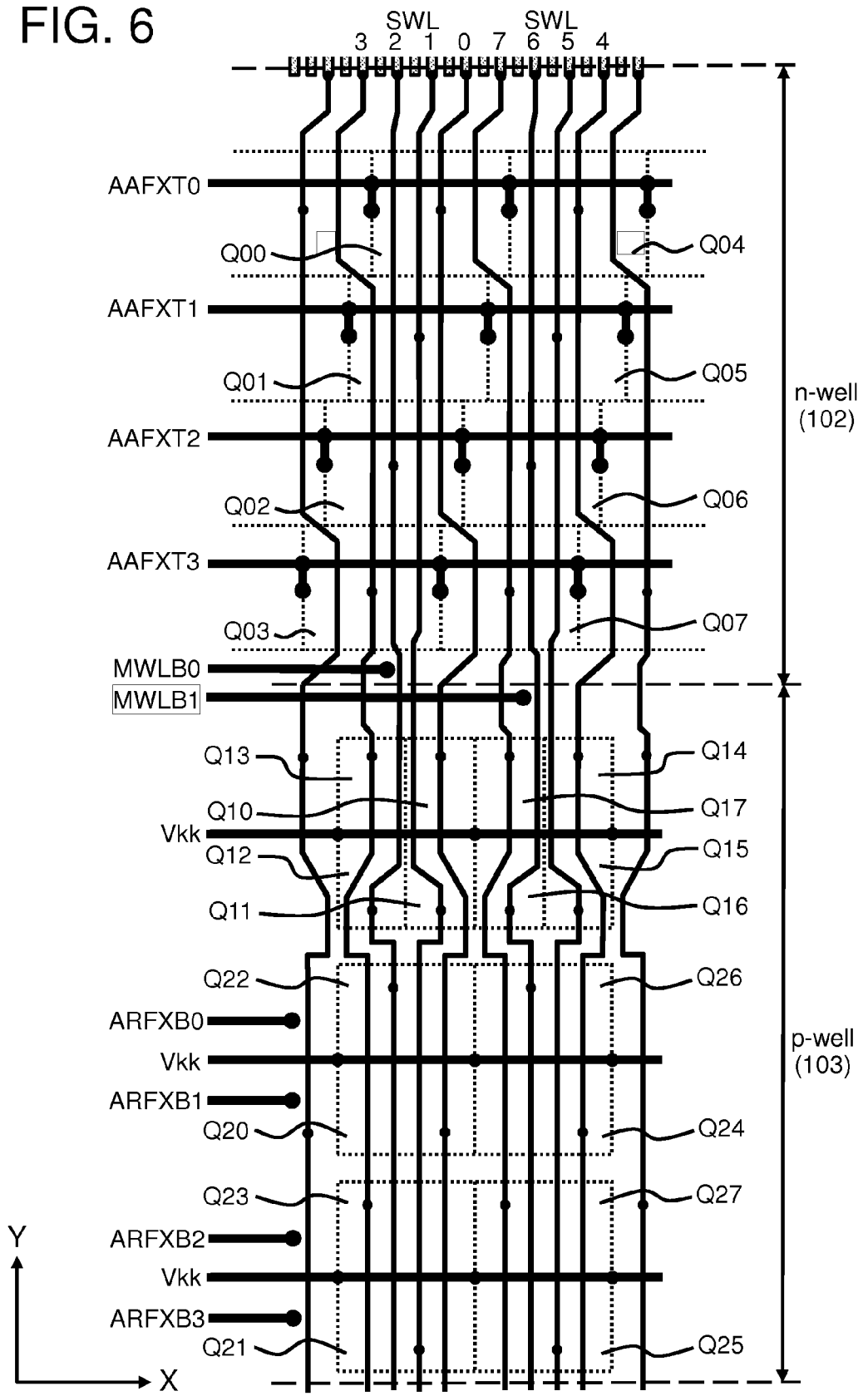
FIG. 6 is a drawing corresponding to FIG. 5 and schematically showing an example of the wiring layout in the sub-word line drivers of the peripheral circuits in the semiconductor device relating to Exemplary Embodiment 1.
Figure 7:
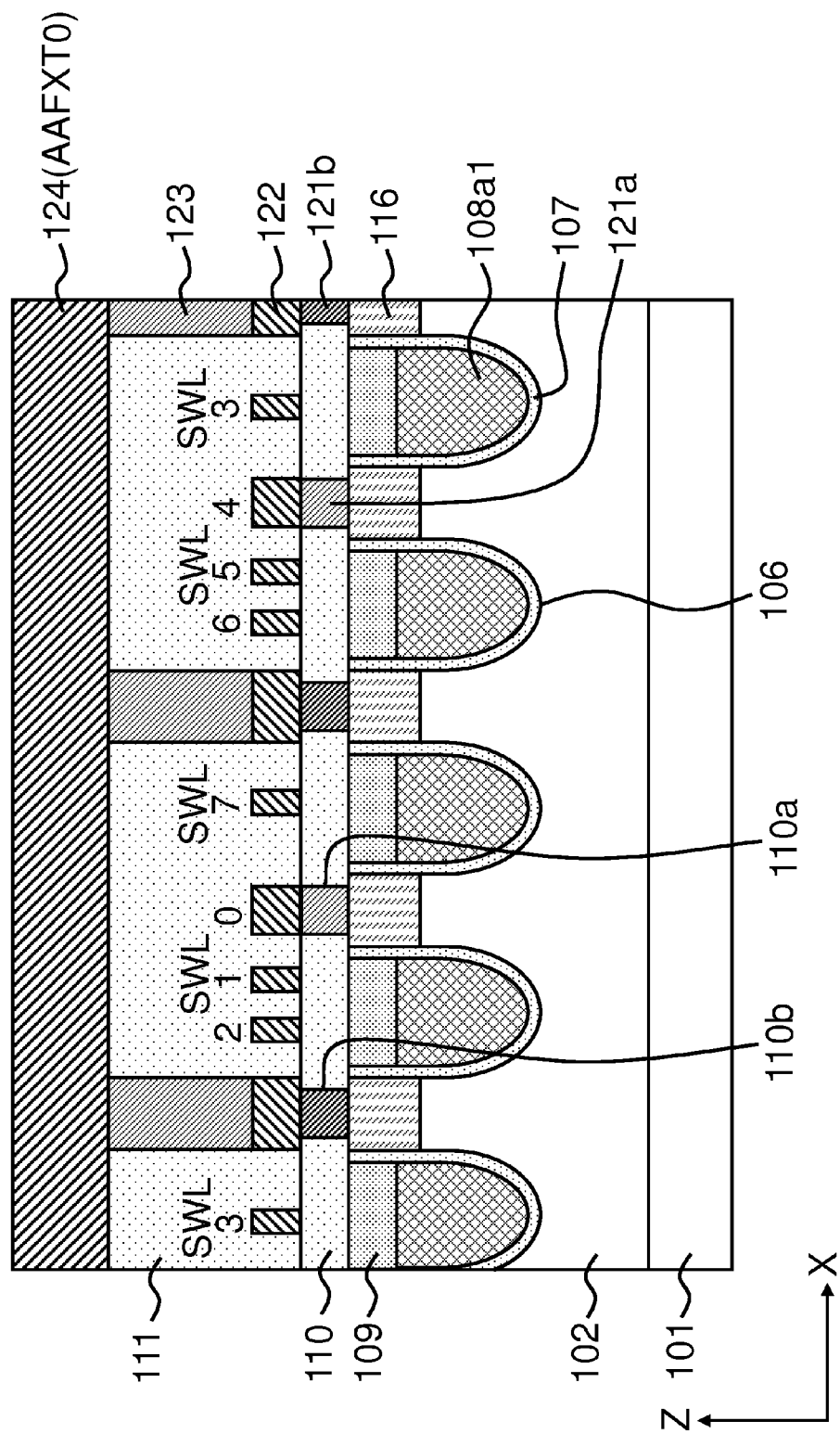
FIG. 7 is a cross sectional view taken along a line A-A' in FIGS. 4 and 5 schematically showing an example of the configuration of the sub-word line drivers of the peripheral circuits in the semiconductor device relating to Exemplary Embodiment 1.

Next, the configuration of the sub-word line drivers of the peripheral circuits in the semiconductor device relating to Exemplary Embodiment 1 will be described with reference to the drawings. FIG. 4 is a drawing schematically showing an example of the layout of the sub-word line drivers of the peripheral circuits in the semiconductor device relating to Exemplary Embodiment 1. FIG. 5 is a drawing corresponding to FIG. 4 and showing an example of how the sub-word line drivers of the peripheral circuits are wired in the semiconductor device relating to Exemplary Embodiment 1. FIG. 6 is a drawing corresponding to FIG. 5 and schematically showing an example of the wiring layout in the sub-word line drivers of the peripheral circuits in the semiconductor device relating to Exemplary Embodiment 1. FIG. 7 is a cross sectional view taken along a line A-A' in FIGS. 4 and 5 schematically showing an example of the configuration of the sub-word line drivers of the peripheral circuits in the semiconductor device relating to Exemplary Embodiment 1. FIG. 8 shows cross sectional views taken along lines B-B' and C-C' in FIGS. 4 and 5 schematically showing an example of the configuration of the sub-word line drivers of the peripheral circuits in the semiconductor device relating to Exemplary Embodiment 1. FIG. 9 shows cross sectional views taken along lines D-D' and E-E' in FIGS. 4 and 5 schematically showing an example of the configuration of the sub-word line drivers of the peripheral circuits in the semiconductor device relating to Exemplary Embodiment 1. FIG. 10 shows cross sectional views taken along lines F-F' and G-G' in FIGS. 4 and 5 schematically showing an example of the configuration of the sub-word line drivers of the peripheral circuits in the semiconductor device relating to Exemplary Embodiment 1.

In a region having the sub-word line drivers SWLD0 to SWLD7 in FIG. 3, an n-well 102 and a p-well 103 are formed adjacent to each other on a semiconductor substrate 101 (for instance a p-type single crystal silicon substrate) (refer to FIGS. 4 to 6 and the cross section along the line G-G' in FIG. 10). On the n-well 102, the pMOS transistors Q00 to Q07 of the sub-word line drivers SWLD0 to SWLD7 in FIG. 3 are formed (refer to FIG. 6). On the p-well 103, the nMOS transistors Q10 to Q17 and nMOS transistors Q20 to Q27 of the sub-word line drivers SWLD0 to SWLD7 in FIG. 3 are formed (refer to FIG. 6). A unit of the nMOS transistors Q10 to Q17 is disposed in a region between a unit of the pMOS transistors Q00 to Q07 and a unit of the nMOS transistors Q20 to Q27.

In the unit of the pMOS transistors Q00 to Q07, the pMOS transistors Q00, Q01, Q02, and Q03 are arranged side by side in this order in the Y direction, the pMOS transistors Q04, Q05, Q06, and Q07 are arranged side by side in this order in the Y direction, and a unit of the pMOS transistors Q00, Q01, Q02, and Q03 and a unit of the pMOS transistors Q04, Q05, Q06, and Q07 are arranged side by side in the X direction (refer to FIG. 6).

In the unit of the nMOS transistors Q10 to Q17, the nMOS transistors Q13, Q10, Q17, and Q14 are arranged side by side in this order in the X direction, the nMOS transistors Q12, Q11, Q16, and Q15 are arranged in this order side by side in the X direction, and a unit of the nMOS transistors Q13, Q10, Q17, and Q14 and a unit of the nMOS transistors Q12, Q11, Q16, and Q15 are arranged side by side in the Y direction (refer to FIG. 6).

In the unit of the nMOS transistors Q20 to Q27, a unit of the nMOS transistors Q22, Q20, Q26, and Q24 and a unit of the nMOS transistors Q23, Q21, Q27, and Q25 are arranged side by side in the Y direction (refer to FIG. 6). In the unit of the nMOS transistors Q22, Q20, Q26, and Q24, the nMOS transistors Q22 and Q20 are arranged side by side in this order in the Y direction, the nMOS transistors Q26 and Q24 are arranged side by side in this order in the Y direction, and a unit of the nMOS transistors Q22 and Q20 and a unit of the nMOS transistors Q26 and Q24 are arranged side by side in the X direction. In the unit of the nMOS transistors Q23, Q21, Q27, and Q25, the nMOS transistors Q23 and Q21 are arranged side by side in this order in the Y direction, the nMOS transistors Q27 and Q25 are arranged side by side in this order in the Y direction, and a unit of the nMOS transistors Q23 and Q21 and the nMOS transistors Q27 and Q25 are arranged side by side in the X direction.

In the n-well 102, a common active region 104a for the pMOS transistors Q00 and Q04, a common active region 104a for the pMOS transistors Q01 and Q05, a common active region 104a for the pMOS transistors Q02 and Q06, and a common active region 104a for the pMOS transistors Q00 and Q04 are arranged side by side in this order in the Y direction (refer to FIGS. 4 to 6). Each of the active regions 104a extends like a strip in the X direction. Element isolation regions 105 are disposed on both sides of each active region 104a in the Y direction. Each active region 104a is surrounded by the element isolation regions 105. Further, the active region 104a is a region that serves as the source electrode, drain electrode, and a channel of the pMOS transistors Q00 to Q07.

In the p-well 103, a common active region 104b for the nMOS transistors Q10 and Q17, a common active region 104c for the nMOS transistors Q22, Q20, Q26, and Q24, and a common active region 104c for the nMOS transistors Q23, Q21, Q27, and Q25 are arranged side by side in this order in the Y direction (refer to FIGS. 4 to 6). The active region 104b is shaped to have a line part 104b1 extending in the X direction and a plurality of branch parts 104b2 protruding from both sides of the line part 104b1 in the Y direction. Each of the active regions 104c is shaped to have a line part 104c1 extending in the X direction and a plurality of branch parts 104c2 protruding from both sides of the line part 104c1 in the Y direction. Two branch parts 104b2 are provided within the width of one branch part 104c2 in the X direction. The element isolation regions 105 are disposed on both sides of the active region 104b and each of the active regions 104c in the Y direction. Each of the active region 104b and the active regions 104c is surrounded by the element isolation regions 105. Further, the active region 104b is a region that serves as a source electrode, drain electrode, and a channel of the nMOS transistors Q10 to Q17. The active regions 104c are regions that serve as a source electrode, drain electrode, and a channel of the nMOS transistors Q20 to Q27.

The element isolation region 105 has the STI (Shallow Trench Isolation) structure in which an insulator (for instance silicon oxide film) is buried in a groove (a groove that does not reach the semiconductor substrate 101) formed on the n-well 102 and the p-well 103 (refer to FIGS. 8 to 10). Viewing from the top of the substrate, the element isolation region 105 is formed in a line shape extending in the X direction between the active regions 104 in the n-well 102 and is formed in a shape having a plurality of branches protruding in the Y direction from both sides of a line part that extends in the X direction in the p-well 103 (refer to FIG. 4). The element isolation region 105 is continuously disposed in an intermediate region between the active regions 104a and 104b.

Gate electrodes 108a, 108b, and 108c (for instance titanium nitride) are formed in gate grooves 106 (grooves shallower than the element isolation region 105) formed in the n-well 102 and the p-well 103 including the element isolation regions 105 in predetermined locations on the n-well 102 and the p-well 103 including the element isolation regions 105 with the gate insulating films 105 (for instance silicon oxide films) interposed therebetween, and cap insulating films 109 (for instance silicon nitride films) are formed over the surfaces of the gate electrodes 108a (108a1, 108a2, and 108a3), 108b, and 108c in the gate grooves 106 (refer to FIGS. 4, 5, and 7 to 10). In regions where the gate electrodes 108a, 108b, and 108c and the element isolation regions 105 overlap, the element isolation regions 105 are disposed underneath the gate electrodes 108a (108a1, 108a2, and 108a3), 108b, and 108c (refer to the B-B' cross section in FIG. 8, the E-E' cross section in FIG. 9, and the G-G' cross section in FIG. 10). The material for the gate electrodes 108a, 108b, and 108c may be the same as the material for the gate electrode of the selection element (the trench MOS transistor in Patent Literature 1) in the memory cell (MC in FIG. 2).

In the region of the n-well 102, the gate electrodes 108a comprise circular parts 108a1 formed in a circular shape (including a ring shape, loop shape, donut shape, and frame shape) on the active regions 104a, and are continuously connected to neighboring circular parts 108a1 in the Y direction on the element isolation regions 105 while being separated from neighboring circular parts 108a1 in the X direction (refer to FIGS. 4 and 5). The circular part 108a1 crosses the active region 104a at different levels. In the region of the p-well 103, the gate electrode 108a comprises the line part 108a2 extending from the circular part 108a1 in the Y direction and comprises branch parts 108a3, two of which protrudes from both side of the line part 108a2 in the X direction (a total of four branches). The line part 108a2 is disposed in a region between predetermined branch parts 104b2 of the active region 104b and crosses the line part 104b1 of the active region 104b at different levels. The branch part 108a3 crosses the branch part 104b2 of the corresponding active region 104b at different levels. Underneath the line part 108a2 and the branch part 108a3, the element isolation region 105 is provided except for regions where the line part 108a2 and the branch part 108a3 overlap the active region 104b.

In the region of the p-well 103, the gate electrode 108b extends along the line part 104c1 of the active region 104c in the X direction and crosses each branch part 104c2 protruding from the line part 104c1 toward the active region 104b at different levels (refer to FIGS. 4 and 5).

In the region of the p-well 103, the gate electrode 108c extends along the line part 104c1 of the active region 104c in the X direction and crosses each branch part 104c2 protruding from the line part 104c1 away from the active region 104b at different levels (refer to FIGS. 4 and 5).

On the n-well 102, p-type diffusion regions 116 (for instance layers in which boron (B) is diffused) are formed in regions except for parts that cross the gate electrodes 108a (108a1) at different levels in the active regions 104a (refer to FIGS. 4, 5, 7, and 8). On the p-well 103, n-type diffusion regions 115 (for instance layers in which phosphorus (P) is diffused) are formed in regions except for parts that cross the gate electrodes 108a (108a2 and 108a3), 108b, and 108c at different levels in the active regions 104b and 104c (refer to FIGS. 4, 5, and 9). Further, the diffusion regions 115 and 116 may comprise LDD (Lightly Doped Drain) regions (not shown in the drawings) in the lower portion thereof.

An interlayer insulating film 110 (for instance a silicon oxide film) is formed on the substrate that includes a gate insulating film 107, the cap insulating film 109, the diffusion regions 115 and 116, and the element isolation region 105 (refer to FIGS. 7 to 10). In the interlayer insulating film 110, contact plugs 121a and 121b (for instance DOPOS: Doped Polycrystalline Silicon) to the diffusion regions 115 and 116 are formed. The contact plug 121a is a contact plug electrically connected to a wiring layer 122 relating to the corresponding sub-word lines SWL0 to SWL07. The contact plug 121b is a contact plug electrically connected to a corresponding wiring layer 124 via the wiring layer 122 (except for the wiring layer 122 relating to the sub-word lines SWL0 to SWL07) and a contact plug 123.

On the interlayer insulating film 110 that includes the contact plugs 121a and 121b, the wiring layer 122 (for instance tungsten nitride/tungsten laminated film) electrically connected to the corresponding contact plugs 121a and 121b are formed (refer to FIGS. 7 to 10). The wiring layer 122 comprises the wiring layer 122 relating to the sub-word lines SWL0 to SWL07 and electrically connected to the contact plug 121a, and the wiring layer 122 electrically connected to the contact plugs 121b and 123.

On the interlayer insulating film 110 that includes the wiring layer 122, an interlayer insulating film 111 (for instance silicon oxide film) is formed (refer to FIGS. 7 to 10). The contact plug 123 (for instance DOPOS: Doped Polycrystalline Silicon) to the wiring layer 122 (only to the one electrically connected to the contact plug 121b) is formed on the interlayer insulating film 111.

Over the interlayer insulating film 111 that includes the contact plug 123, the wiring layer 124 (for instance tungsten nitride/tungsten laminated film) electrically connected to any of the sub-word line selection signal lines AAFXT0 to AAFXT3 and the reference potential line Vkk is formed (refer to FIGS. 5 to 10).

The sub-word line selection signal line AAFXT0 is electrically connected to the common diffusion region 116 for the pMOS transistors Q00 and Q04 via the corresponding wiring layer 124, contact plug 123, wiring layer 122, and contact plug 121b. The sub-word line selection signal line AAFXT1 is electrically connected to the common diffusion region 116 for the pMOS transistors Q01 and Q05 via the corresponding wiring layer 124, contact plug 123, wiring layer 122, and contact plug 121b. The sub-word line selection signal line AAFXT2 is electrically connected to the common diffusion region 116 for the pMOS transistors Q02 and Q06 via the corresponding wiring layer 124, contact plug 123, wiring layer 122, and contact plug 121b. The sub-word line selection signal line AAFXT3 is electrically connected to the common diffusion region 116 for the pMOS transistors Q03 and Q07 via the corresponding wiring layer 124, contact plug 123, wiring layer 122, and contact plug 121b. The reference potential line Vkk is electrically connected to the common diffusion regions 115 for predetermined nMOS transistors (the common diffusion region 115 for Q10 to Q17, the common diffusion region 115 for Q22, Q20, Q26, and Q24, and the common diffusion region 115 for Q23, Q21, Q27, and Q25) via the corresponding wiring layer 124, contact plug 123, wiring layer 122, and contact plug 121b.

The address signal line MWLB0 is electrically connected to the corresponding gate electrodes 108a (108a1, 108a2, and 108a3). The address signal line MWLB1 is electrically connected to the corresponding gate electrodes 108a (108a1, 108a2, and 108a3; excluding the gate electrodes 108a electrically connected to the address signal line MWLB0). The sub-word line non-selection signal line ARFXB0 is electrically connected to the corresponding gate electrodes 108b. The sub-word line non-selection signal line ARFXB1 is electrically connected to the corresponding gate electrodes 108c. The sub-word line non-selection signal line ARFXB2 is electrically connected to the corresponding gate electrodes 108b (excluding the gate electrodes 108b electrically connected to the sub-word line non-selection signal line ARFXB0). The sub-word line non-selection signal line ARFXB3 is electrically connected to the corresponding gate electrodes 108c (excluding the gate electrodes 108c electrically connected to the sub-word line non-selection signal line ARFXB1).

Next, a method for manufacturing the sub-word line driver of the peripheral circuits in the semiconductor device relating to Exemplary Embodiment 1 will be described with reference to the drawings. FIGS. 11 and 12 are process cross-sectional views taken along the line A-A' in FIGS. 4 and 5 and schematically showing an example of the method for manufacturing the sub-word line driver of the peripheral circuits in the semiconductor device relating to Exemplary Embodiment 1. Here, a process example of manufacturing a part in the sub-word line driver of the peripheral circuits in the semiconductor device corresponding to the line A-A' in FIGS. 4 and 5 will be described.

Figure 11A:
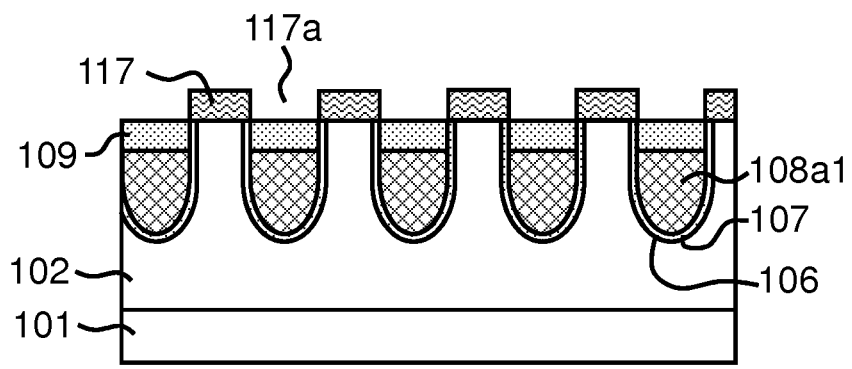
FIGS. 11A, 11B, and 11C are process cross-sectional views taken along the line A-A' in FIGS. 4 and 5 and schematically showing an example of a method for manufacturing the sub-word line driver of the peripheral circuits in the semiconductor device relating to Exemplary Embodiment 1.

First, the element isolation region (105 in FIG. 4) is formed on the semiconductor substrate 101, then the n-well 102 is formed by injecting an impurity (for instance phosphorus) into a desired region on the semiconductor substrate 101, then a hard mask 117 (for instance a silicon oxide film) is formed in a predetermined location on the n-well 102, then the gate groove 106 is formed using the hard mask 117 as a mask material in the n-well 102 that includes the element isolation region (105 in FIG. 4), then the gate insulating film 107 (for instance silicon oxide film) is formed on the inner wall surface of the gate groove 106, then the circular part 108a1 (a portion of the gate electrode 108a in FIG. 4) is formed on the gate insulating film 107 in the lower portion of the gate groove 106, and then the cap insulating film 109 covering over the circular part 108a1 is formed on the upper portion of the gate groove 106 (step A1; refer to FIG. 11A). When the cap insulating film 109 is formed, it is desired that the upper surface of the cap insulating film 109 be processed to be approximately flat against the upper surface of the n-well 102.

Figure 11B:
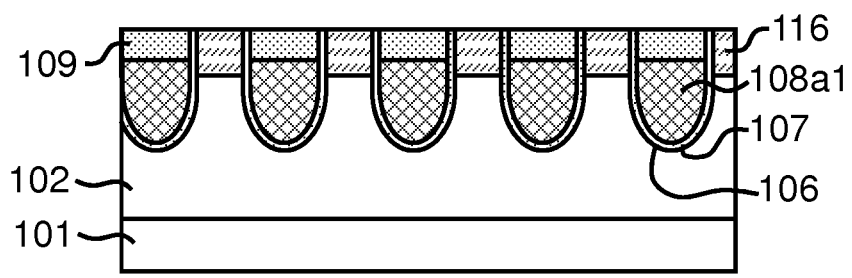

Next, the hard mask (117 in FIG. 11A) is removed, then an impurity (for instance boron) is injected into the n-well 102, and then the diffusion region 116 is formed by self-alignment with the element isolation region (105 in FIG. 4) and the cap insulating film 109 (step A2; refer to FIG. 11B). Further, an extension region and pocket region to make an LDD structure may be formed before the diffusion region 116 is formed.

Figure 11C:
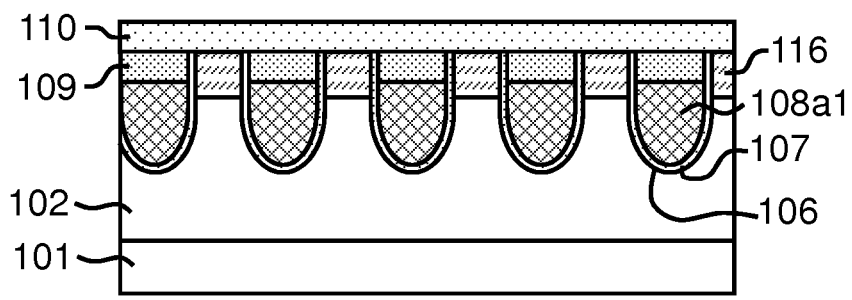

Next, the interlayer insulating film 110 is formed over the n-well 102 that includes the cap insulating film 109 (step A3; refer to FIG. 11C).

Figure 12A:
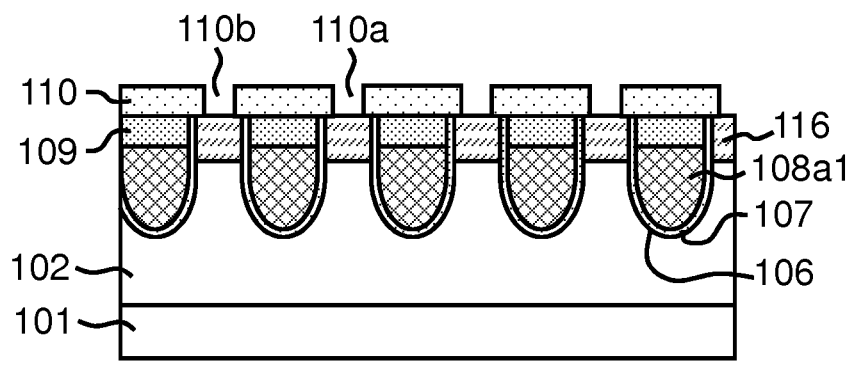
FIGS. 12A and 12B are process cross-sectional views continued from
FIGS. 11A, 11B, and 11C and schematically showing an example of the method for manufacturing the sub-word line driver of the peripheral circuits in the semiconductor device relating to Exemplary Embodiment 1.

Next, holes 110a and 110b leading to the n-well 102 are formed in the interlayer insulating film 110 using lithography and dry etching techniques (step A4; refer to FIG. 12A).

Figure 12B:
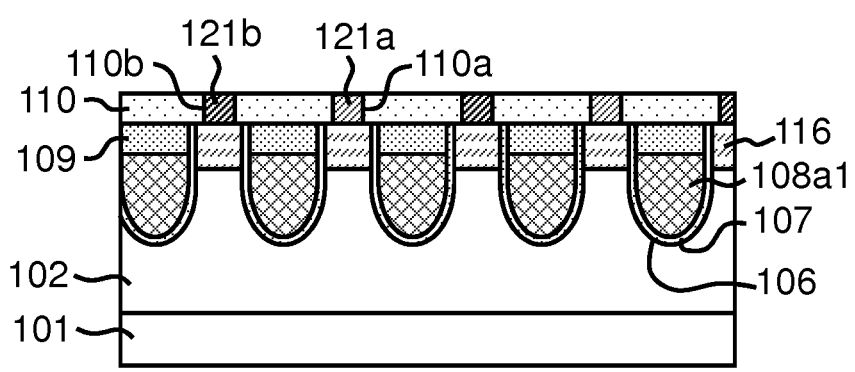

Next, the contact plugs 121a and 121b are buried in the holes 110a and 110b using a sputtering technique, CVC (Chemical Vapor Deposition), and CMP (Chemical Mechanical Polishing) (step A5; refer to FIG. 12B).

Then, the wiring layer 122 is formed over the interlayer insulating film 110 that includes the contact plugs 121a and 121b, then the interlayer insulating film 111 is formed over the interlayer insulating film 110 that includes the wiring layer 122, then a hole leading to the wiring layer 122 connected to the contact plug 121b is formed in the interlayer insulating film 111, then the contact plug 123 is buried in this hole, and then the wiring layer 124 is formed over the interlayer insulating film 111 that includes the contact plug 123 (step A6; refer to FIG. 7).

Further, parts not shown in FIG. 7 can be manufactured in the same steps as the steps A1 to A6 except for the differences in the conductivity types of the diffusion region and the wells.

According to Exemplary Embodiment 1, the pitch of the transistors Q00 to Q07, Q10 to Q17, and Q20 to Q27 can be reduced while ensuring the reliability, both the performance and characteristics of the transistors Q00 to Q07, Q10 to Q17, and Q20 to Q27 can be ensured, and the standby current can be reduced by decreasing the leakage current. In other words, a low power consumption design becomes possible due to a decrease in the GIDL of the pMOS transistors Q00 to Q07 in the sub-word driver SWD, and the reliability of the transistors can be ensured. Further, the trench structure of the transistors Q00 to Q07, Q10 to Q17, and Q20 to Q27 makes it easy to secure an effective gate length Leff, contributing to improving the reliability against the HCI (Hot Carrier Injection). Further, the junction electric field can be mitigated by lengthening the effective gate length Leff, and the GIDL can be reduced. Further, the voltage Vpp can be increased as much as the mitigation of the junction electric field, improving the cell performance. Moreover, due to the trench structure of the transistors Q00 to Q07, Q10 to Q17, and Q20 to Q27, abnormal leakage is less likely to occur at a point of contact between the diffusion region 116 and the contact plugs 121a and 121b and the current yield can be improved.

[Exemplary Embodiment 2]

Figure 13:
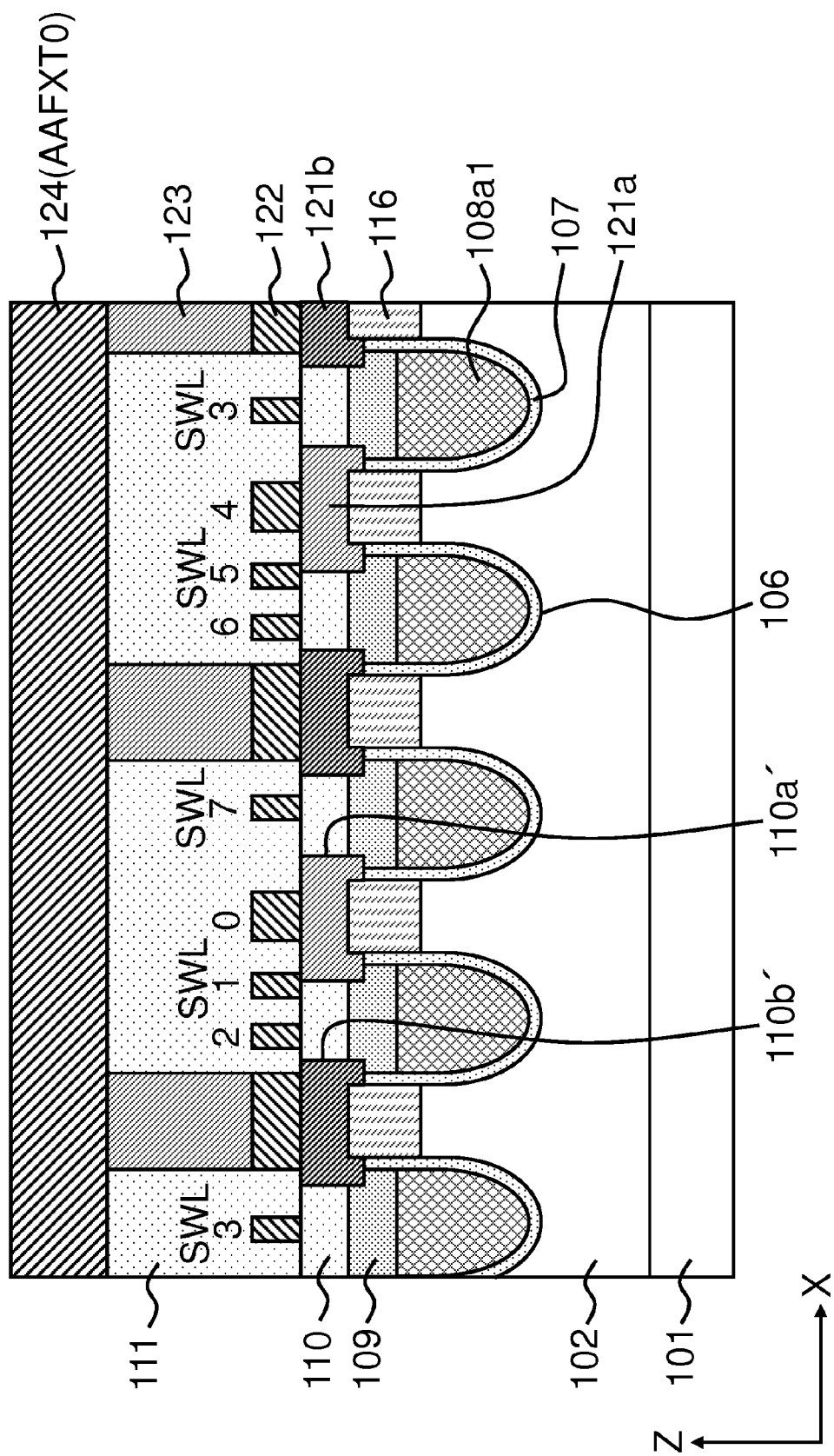
FIG. 13 is a cross sectional view schematically showing a configuration example of a sub-word line driver of peripheral circuits in a semiconductor device relating to Exemplary Embodiment 2.

A semiconductor device relating to Exemplary Embodiment 2 will be described with reference to the drawings of the present disclosure. FIG. 13 is a cross sectional view schematically showing a configuration example of a sub-word line driver of peripheral circuits in the semiconductor device relating to Exemplary Embodiment 2. Note that FIG. 13 corresponds to the cross sectional view taken along the line A-A' in FIGS. 4 and 5.

Exemplary Embodiment 2 is a variation of Exemplary Embodiment 1; the contact plugs 121a and 121b are also provided over the gate groove 106 and the contact plugs 121a and 121b are in contact with the cap insulating film 109. Otherwise, the configuration of Exemplary Embodiment 2 is the same as that of Exemplary Embodiment 1. Note that the contact plugs 121a and 121b not shown in FIG. 13 are the same as the contact plugs 121a and 121b shown in FIG. 13.

Next, a method for manufacturing the sub-word line driver of the peripheral circuits in the semiconductor device relating to Exemplary Embodiment 2 will be described with reference to the drawings. Figs. 14 and 15 are process cross-sectional views schematically showing an example of the method for manufacturing the sub-word line driver of the peripheral circuits in the semiconductor device relating to Exemplary Embodiment 2.

Figure 14A:
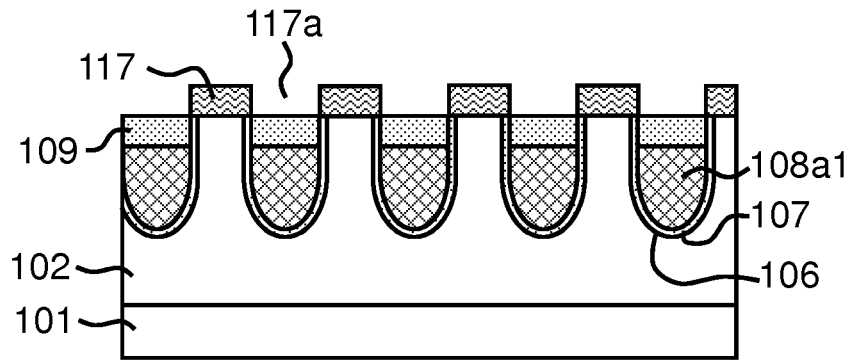
FIGS. 14A, 14B, and 14C are process cross-sectional views schematically showing an example of a method for manufacturing the sub-word line driver of the peripheral circuits in the semiconductor device relating to Exemplary Embodiment 2.

First, the element isolation region (corresponding to 105 in FIG. 4) is formed on the semiconductor substrate 101, then the n-well 102 is formed by injecting an impurity (for instance phosphorus) into a desired region on the semiconductor substrate 101, then the hard mask 117 (for instance a silicon oxide film) is formed in a predetermined location on the n-well 102, then the gate groove 106 is formed using the hard mask 117 as a mask material in the n-well 102 that includes the element isolation region (corresponding to 105 in FIG. 4), then the gate insulating film 107 (for instance silicon oxide film) is formed on the inner wall surface of the gate groove 106, then the circular part 108a1 (corresponding to a portion of the gate electrode 108a in FIG. 4) is formed on the gate insulating film 107 in the lower portion of the gate groove 106, and then the cap insulating film 109 covering over the circular part 108a1 is formed on the upper portion of the gate groove 106 (step B1; refer to FIG. 14A). When the cap insulating film 109 is formed, it is desired that the upper surface of the cap insulating film 109 be processed to be approximately flat against the upper surface of the n-well 102.

Figure 14B:
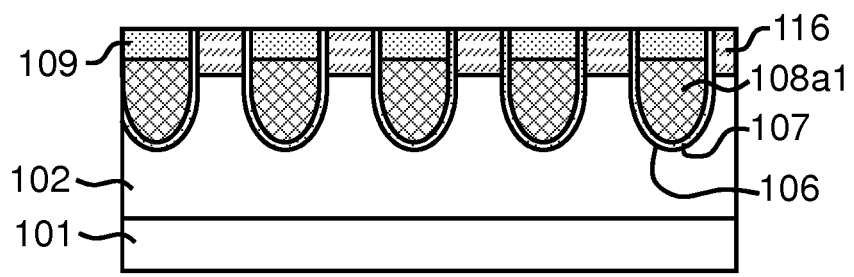

Next, the hard mask (117 in FIG. 14A) is removed, then an impurity (for instance boron) is injected into the n-well 102, and then the diffusion region 116 is formed by self-alignment with the element isolation region (105 in FIG. 4) and the cap insulating film 109 (step B2; refer to FIG. 14B). Further, an extension region and pocket region to make an LDD structure may be formed before the diffusion region 116 is formed.

Figure 14C:
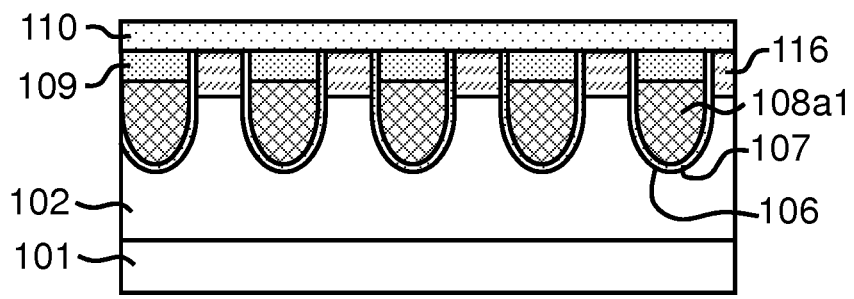

Next, the interlayer insulating film 110 is formed over the n-well 102 that includes the cap insulating film 109 (step B3; refer to FIG. 14C).

Figure 15A:
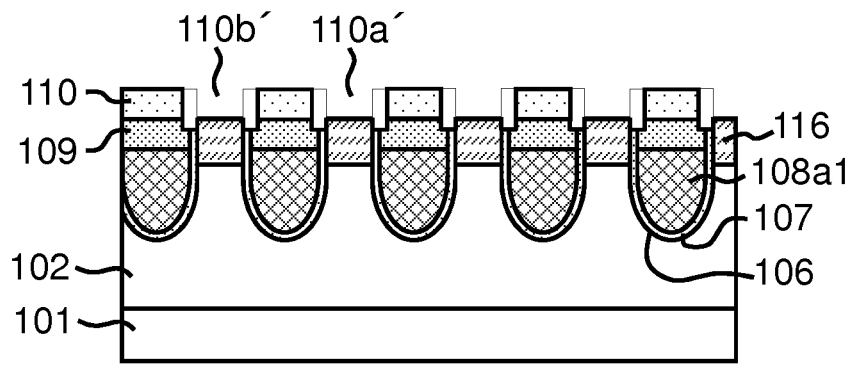
FIGS. 15A and 15B process cross-sectional views continued from FIGS. 14A, 14B, and 14C and schematically showing an example of the method for manufacturing the sub-word line driver of the peripheral circuits in the semiconductor device relating to Exemplary Embodiment 2.

Next, holes 110a' and 110b' (having openings larger than those of 110a and 110b in FIG. 12A) leading to the n-well 102 are formed in the interlayer insulating film 110 using lithography and dry etching techniques (step B4; refer to FIG. 15A). Here, the holes 110a' and 110b' larger than the holes 110a and 110b in FIG. 12A can be formed by etching through large photoresist openings (not shown in the drawings). When the holes 110a' and 110b' are formed in the step B4, the interlayer insulating film 110 is selectively etched.

Some parts of the cap insulating film 109 and the gate insulating film 107 are sometimes etched due to over-etching, but this does not cause any problem as long as there is no negative impact on the insulation properties between the contact plugs 121a and 121b and the circular part 108a1 (corresponding to a portion of the gate electrode 108a in FIG. 4).

Figure 15B:
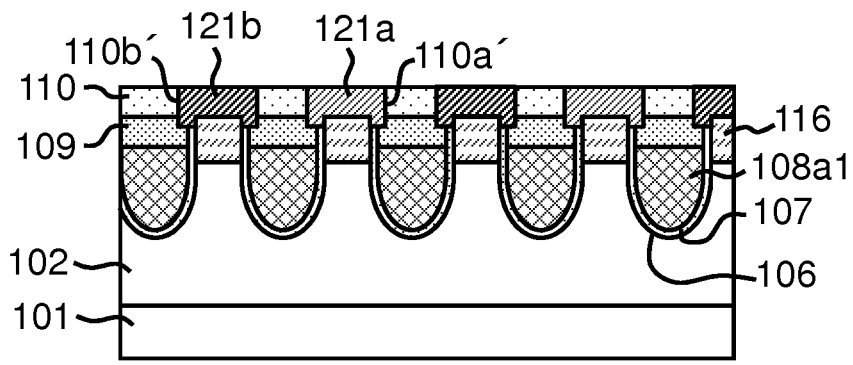

Next, the contact plugs 121a and 121b are buried in the holes 110a' and 110b' using a sputtering technique, CVC (Chemical Vapor Deposition), and CMP (Chemical Mechanical Polishing) (step B5; refer to FIG. 15B).

Then, the wiring layer 122 is formed over the interlayer insulating film 110 that includes the contact plugs 121a and 121b, then the interlayer insulating film 111 is formed over the interlayer insulating film 110 that includes the wiring layer 122, then a hole leading to the wiring layer 122 connected to the contact plug 121b is formed in the interlayer insulating film 111, then the contact plug 123 is buried in this hole, and then the wiring layer 124 is formed over the interlayer insulating film 111 that includes the contact plug 123 (step B6; refer to FIG. 13).

Further, parts not shown in FIG. 13 can be manufactured in the same steps as the steps B1 to B6 except for the differences in the conductivity types of the diffusion region and the wells.

According to Exemplary Embodiment 2, the same effects as in Exemplary Embodiment 1 can be obtained and the pitch of the transistors (corresponding to Q00 to Q07, Q10 to Q17, and Q20 to Q27 in FIGS. 3 and 6) can be reduced.

[Exemplary Embodiment 3]

Figure 16:
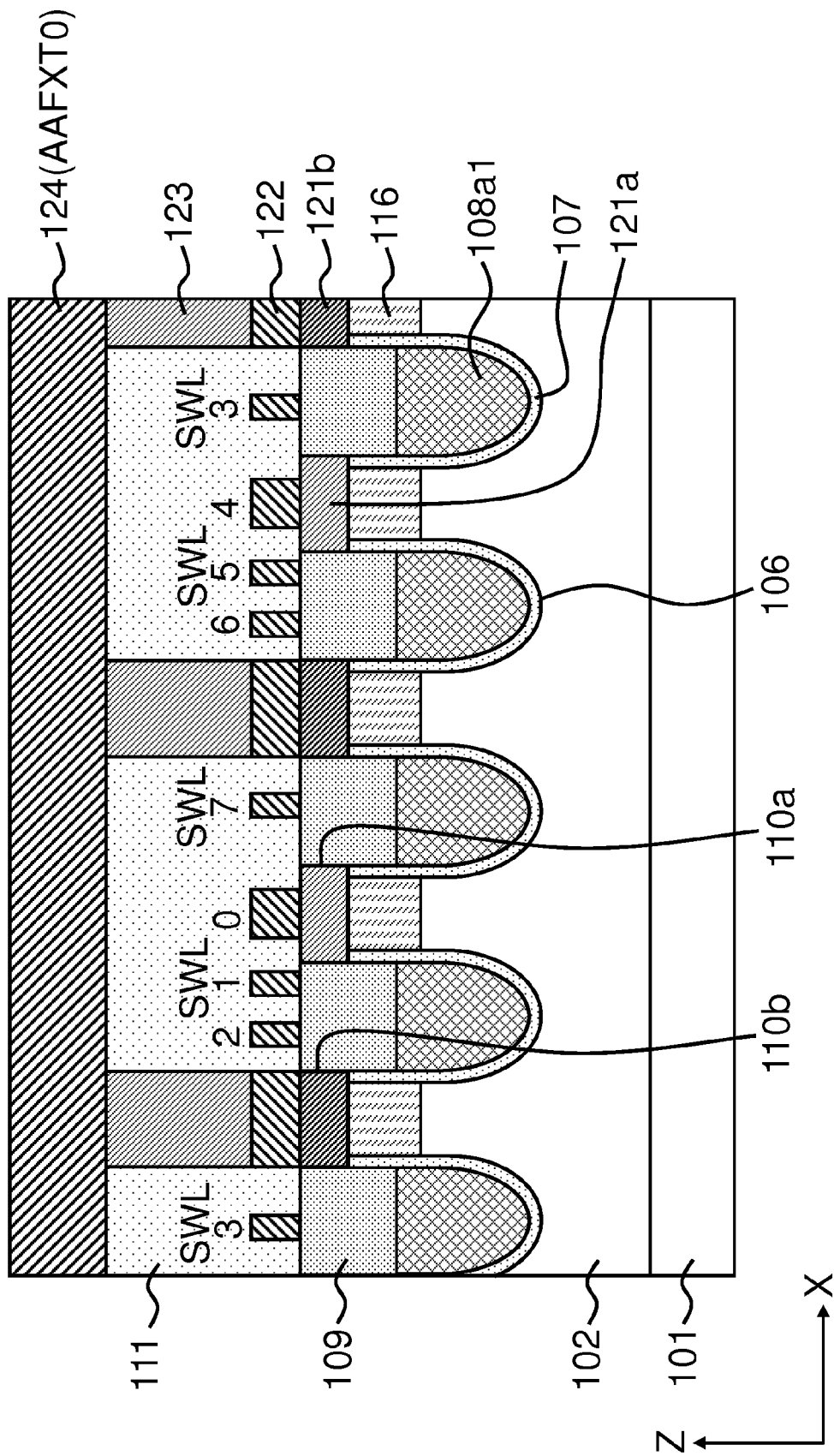
FIG. 16 is a cross sectional view schematically showing a configuration example of a sub-word line driver of peripheral circuits in a semiconductor device relating to Exemplary Embodiment 3.

A semiconductor device relating to Exemplary Embodiment 3 will be described with reference to the drawings of the present disclosure. FIG. 16 is a cross sectional view schematically showing a configuration example of a sub-word line driver of peripheral circuits in the semiconductor device relating to Exemplary Embodiment 3. Note that FIG. 16 corresponds to the cross sectional view taken along the line A-A' in FIGS. 4 and 5.

Exemplary Embodiment 3 is a variation of Exemplary Embodiment 2; instead of some parts of the interlayer insulating film (110 in FIG. 7), the cap insulating film 109 is formed to protrude above the upper surface of the diffusion region 116, the holes 110a and 110b leading to the diffusion region 116 are formed in the interlayer insulating film (110 in FIG. 17C) buried in an opening part (109a in FIG. 17B) of the cap insulating film 109, and the contact plugs 121a and 121b are buried in 110a and 110b. The contact plugs 121a and 121b are formed by self-alignment in the cap insulating film 109. Otherwise, the configuration of Exemplary Embodiment 3 is the same as that of Exemplary Embodiment 1.

Next, a method for manufacturing the sub-word line driver of the peripheral circuits in the semiconductor device relating to Exemplary Embodiment 3 will be described with reference to the drawings. FIGS. 17 and 18 are process cross-sectional views schematically showing an example of the method for manufacturing the sub-word line driver of the peripheral circuits in the semiconductor device relating to Exemplary Embodiment 3.

Figure 17A:
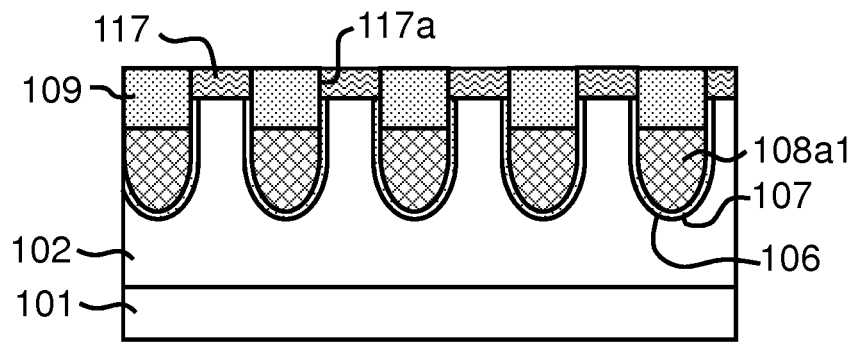
FIGS. 17A, 17B, and 17C are process cross-sectional views schematically showing an example of a method for manufacturing the sub-word line driver of the peripheral circuits in the semiconductor device relating to Exemplary Embodiment 3.

First, the element isolation region (corresponding to 105 in FIG. 4) is formed on the semiconductor substrate 101, then the n-well 102 is formed by injecting an impurity (for instance phosphorus) into a desired region on the semiconductor substrate 101, then the hard mask 117 (for instance a silicon oxide film) is formed in a predetermined location on the n-well 102, then the gate groove 106 is formed using the hard mask 117 as a mask material in the n-well 102 that includes the element isolation region (corresponding to 105 in FIG. 4), then the gate insulating film 107 (for instance silicon oxide film) is formed on the inner wall surface of the gate groove 106, then the circular part 108a1 (corresponding to a portion of the gate electrode 108a in FIG. 4) is formed on the gate insulating film 107 in the lower portion of the gate groove 106, and then the cap insulating film 109 covering over the circular part 108a1 is formed on the upper portion of the gate groove 106 that includes an opening part 117a of the hard mask 117 (step C1; refer to FIG. 17A). When the cap insulating film 109 is formed, the upper surface of the cap insulating film 109 is approximately flat against the upper surface of the hard mask 117, i.e., the cap insulating film 109 is processed to protrude upwardly over the upper surface of the n-well 102.

Figure 17B:
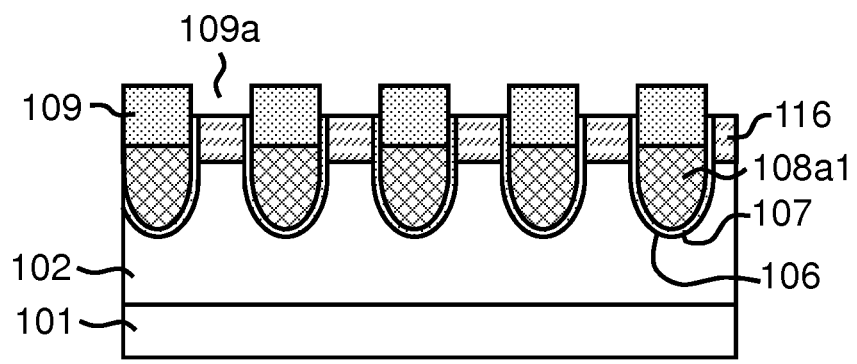

Next, the hard mask (117 in FIG. 17A) is removed, then an impurity (for instance boron) is injected into the n-well 102 exposed from the opening parts 109a and 109b of the cap insulating film 109, and then the diffusion region 116 is formed by self-alignment with the element isolation region (105 in FIG. 4) and the cap insulating film 109 (step C2; refer to FIG. 17B). Further, an extension region and pocket region to make an LDD structure may be formed before the diffusion region 116 is formed.

Figure 17C:
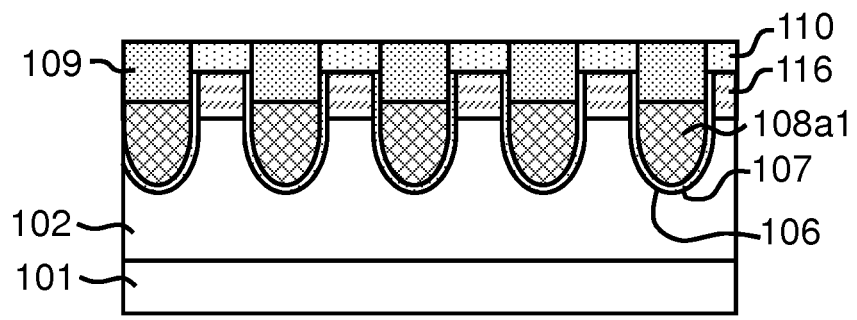

Next, the interlayer insulating film 110 is formed over the cap insulating film 109 that includes the n-well 102, and then the surface of the interlayer insulating film 110 is planarized by CMP (Chemical Mechanical Polishing) until the cap insulating film 109 is exposed (step C3; refer to FIG. 17C).

Figure 18A:
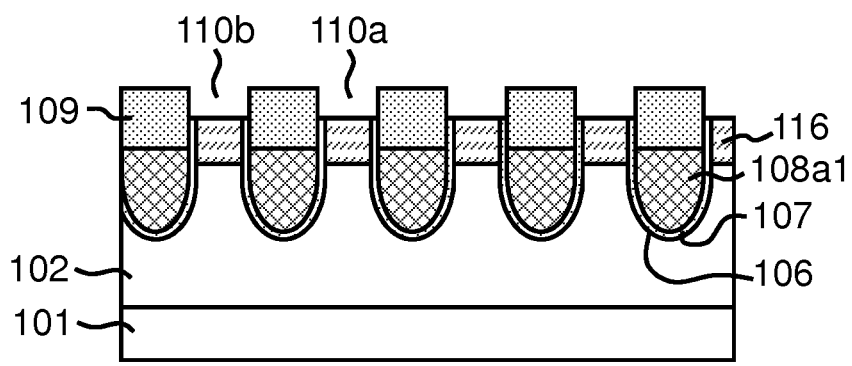
FIGS. 18A and 18B process cross-sectional views continued from Figs. 17A, 17B, and 17C and schematically showing an example of the method for manufacturing the sub-word line driver of the peripheral circuits in the semiconductor device relating to Exemplary Embodiment 3.

Next, the holes 110a and 110b (a portion of the opening part 109a of the cap insulating film 109) leading to the n-well 102 are formed in the interlayer insulating film 110 using lithography and dry etching techniques (step C4; refer to FIG. 18A). In the step C4, for instance, a line-shaped opening that crosses each of a plurality of the circular parts 108a1 disposed (each of which corresponds to a portion of the gate electrode 108a in FIG. 4) is provided on photoresist (not shown in the drawings), then the interlayer insulating film 110 is selectively dry-etched using the photoresist as a mask, and then the photoresist is removed. At this time, by having dry etching conditions in which the etching rate for the cap insulating film 109 is smaller than the etching rate for the interlayer insulating film 110, the cap insulating film 109 is left protruding upwardly from the upper surface of the n-well 102, forming the holes 110a and 110b by self-alignment with the gate groove 106.

Figure 18B:
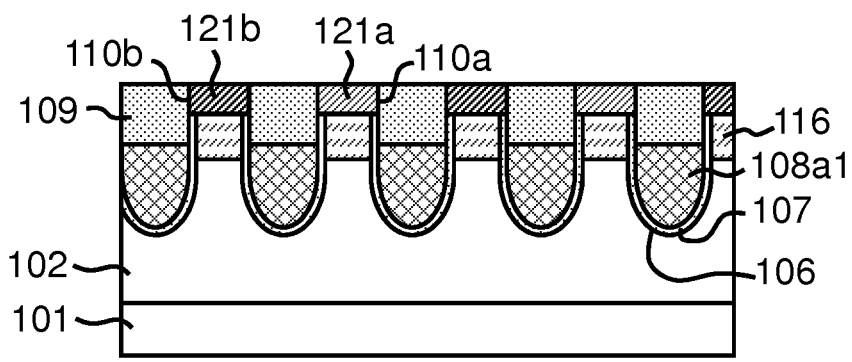

Next, the contact plugs 121a and 121b are buried in the holes 110a and 110b using a sputtering technique, CVC (Chemical Vapor Deposition), and CMP (Chemical Mechanical Polishing) (step C5; refer to FIG. 18B).

Then, the wiring layer 122 is formed over the cap insulating film 109 that includes the contact plugs 121a and 121b and the interlayer insulating film (the interlayer insulating film 110 in regions not shown in the drawings), then the interlayer insulating film 111 is formed over the cap insulating film 109 that includes the wiring layer 122 and the interlayer insulating film (the interlayer insulating film 110 in regions not shown in the drawings), then a hole leading to the wiring layer 122 connected to the contact plug 121b is formed in the interlayer insulating film 111, then the contact plug 123 is buried in this hole, and then the wiring layer 124 is formed over the interlayer insulating film 111 that includes the contact plug 123 (step C6; refer to FIG. 16).

Further, parts not shown in FIG. 16 can be manufactured in the same steps as the steps C1 to C6 except for the differences in the conductivity types of the diffusion region and the wells.

According to Exemplary Embodiment 3, the same effects as in Exemplary Embodiment 1 can be obtained, and since the contact plugs 121a and 121b on the diffusion region 116, which serve as the source/drain of the transistors (corresponding to Q00 to Q07, Q10 to Q17, and Q20 to Q27 in FIGS. 3 and 6), can be formed by self-alignment in the cap insulating film 109 formed on the buried gate electrode (the circular part 108a), the transistor pitch can be greatly reduced without sacrificing the reliability or exacerbating the leakage current.

(Appendix)

The following modes are possible in the present without disclosure limitation.

In a first aspect of the present disclosure, a semiconductor device comprises a semiconductor substrate including first and second regions that have different conductivity types from each other; an isolation region extending continuously over the first and second regions and having a shallow trench covered by a field insulator; first and second active regions placed in respective first and second regions and being each surrounded by the isolation region; a gate electrode disposed in a lower portion of a gate groove that extends continuously from the first active region to the second active region via the isolation region, the gate groove being shallower than the shallow trench; a cap insulating film disposed in an upper portion of the gate groove so as to cover an upper surface of the gate electrode; first and second transistors placed in respective first and second active regions and sharing the gate electrode; and a logic circuit including the first and second transistors connected in series.

In the semiconductor device of the present invention, it is preferred that the isolation region continuously extend over an intermediate region between the first and second active regions and continuously extend underneath the gate electrode in a region where the intermediate region and the gate electrode overlap.

In the semiconductor device of the present invention, it is preferred that the semiconductor device of the present invention comprise a plurality of memory cells and a plurality of sub-word lines electrically connected to the plurality of memory cells and to the logic circuit, and that the logic circuit drive the plurality of memory cells via the sub-word line.

In the semiconductor device of the present invention, it is preferred that the first transistor include eleventh and twelfth diffusion regions on both sides of a channel in the first active region, and the second transistor include twenty-first and twenty-second diffusion regions on both sides of a channel in the second active region.

In the semiconductor device of the present invention, it is preferred that the semiconductor device of the present invention comprise an address signal line outputting a row address signal that selects a sub-word line in the same row from the plurality of sub-word lines and electrically connected to the gate electrode.

In the semiconductor device of the present invention, it is preferred that the semiconductor device of the present invention further comprise a third active region placed in the second region, being surrounded by the isolation region, and isolated from the second active region; another gate groove placed in the second region including the third active region and the isolation region, being shallower than the isolation region, and isolated from the gate groove; and a third transistor placed in the second region and having a second gate electrode buried in a lower portion of the another gate groove, and that the logic circuit have the second and third transistors connected in parallel.

In the semiconductor device of the present invention, it is preferred that the third transistor include thirty-first and thirty-second diffusion regions on both sides of a channel in the third active region.

In the semiconductor device of the present invention, it is preferred that the semiconductor device of the present invention comprise a sub-word line non-selection signal line outputting a signal that deselects a sub-word line in the same column out of the plurality of sub-word lines and electrically connected to the second gate electrode.

In the semiconductor device of the present invention, it is preferred that the semiconductor device of the present invention comprise a sub-word line selection signal line outputting a column address signal that selects a sub-word line in the same column from the plurality of sub-word lines and electrically connected to the eleventh diffusion region, and a reference potential line supplying a reference potential that sets the plurality of sub-word lines to a low level and electrically connected to each of the twenty-first and thirty-first diffusion regions, and that all of the twelfth, twenty-second, and thirty-second diffusion regions be electrically connected to corresponding sub-word lines out of the plurality of sub-word lines.

In a second aspect of the present disclosure, a semiconductor device comprises a semiconductor substrate including first and second regions having first and second conductivity types, respectively; an isolation region extending in each of the first and second regions; first and second active regions placed in respective first and second regions and each surrounded by the isolation region; a gate electrode buried in a lower portion of a gate groove that extends continuously from the first active region to the second active region via the isolation region; and a cap insulating film buried in an upper portion of the gate groove and covering an upper surface of the gate electrode.

In the semiconductor device of the present invention, it is preferred that the gate electrode have a circular part formed in a circular shape on the first active region.

In the semiconductor device of the present invention, it is preferred that a portion of the circular part be placed on the isolation region.

In the semiconductor device of the present invention, it is preferred that the first active region be a plurality of first active regions formed in a band shape in a first direction, and that the gate electrode have a circular part formed in a circular shape on each of the first active regions and be continuously connected to the circular part adjacent in a direction different from the first direction on the isolation region.

In the semiconductor device of the present invention, it is preferred that the first active region have an eleventh diffusion region in a region outside the circular part and have a twelfth diffusion region in a region within the circular part.

In the semiconductor device of the present invention, it is preferred that the semiconductor device of the present invention comprise first and second contact plugs electrically connected to the eleventh and twelfth diffusion regions, respectively.

In the semiconductor device of the present invention, it is preferred that one or both of the first and second contact plugs also be disposed on the gate groove and in contact with the cap insulating film.

In the semiconductor device of the present invention, it is preferred that the cap insulating film have a portion positioned higher than an upper surface of the eleventh and twelfth diffusion regions, an interlayer insulating film buried in an opening of the cap insulating film be provided, the interlayer insulating film have first and second holes leading to the eleventh and twelfth diffusion regions, respectively, and the first and second contact plugs be buried in the first and second holes, respectively.

In the semiconductor device of the present invention, it is preferred that the semiconductor device of the present invention comprise the second active region having twenty-first and twenty-second diffusion regions on both sides of a channel along the gate groove, and third and fourth contact plugs electrically connected to the twenty-first and twenty-second diffusion regions, respectively.

In the semiconductor device of the present invention, it is preferred that one or both of the third and fourth contact plugs be disposed on the gate groove and in contact with the cap insulating film.

In the semiconductor device of the present invention, it is preferred that the cap insulating film have a portion positioned higher than an upper surface of the twenty-first and twenty-second diffusion regions, an interlayer insulating film buried in an opening of the cap insulating film be provided, the interlayer insulating film have third and fourth holes leading to the twenty-first and twenty-second diffusion regions, respectively, and the third and fourth contact plugs be buried in the third and fourth holes, respectively.

In a third aspect of the present disclosure, a semiconductor device comprises a semiconductor substrate including first and second regions that have different conductivity types from each other; an isolation region covered by a field insulator and extending over the first and second regions; and a conductive material disposed in a groove that extends continuously over the first and second regions, the groove disposed within the field insulator.

In the semiconductor device of the present disclosure, it is preferred that the semiconductor device of the present disclosure comprises a plurality of memory cells placed in the second region, the conductive material as a sub-word line extending over the plurality of memory cells; and an additional conductive material connecting to the conductive material over the second region.

In a fourth aspect of the present disclosure, a semiconductor device comprises a semiconductor substrate including a first region and a second region that have different conductivity types from each other; an isolation region placed in the first region and the second region, respectively; a first active region placed in the first region and being surrounded by the isolation region; a second active region placed in the second region and being surrounded by the isolation region; a gate groove placed continuously in the first and second regions including the first and second active regions and the isolation region with the gate groove being shallower than the isolation region; a first transistor placed in the first region, and having a first gate electrode disposed in a lower portion of the gate groove, with the first gate electrode overcrossing with the first active region; a second transistor placed in the second region, and having a second gate electrode disposed in a lower portion of the gate groove, with the second gate electrode overcrossing with the second active region and connected continuously to the first gate electrode; and a cap insulating film buried in an upper portion of the gate groove so as to cover an upper surface of the first and second gate electrodes; wherein the isolation region is also placed under the first and second gate electrodes in a region overlapping with the first and second gate electrode; and wherein the first and second transistors constitute a part of a logic circuit connected in series.

In the semiconductor device of the present disclosure, it is preferred that the isolation region is continuously also placed in an intermediate region between the first active region and the second active regions- and continuously also placed under the first and second gate electrodes in a region where the intermediate region is overlapping with the first and second gate electrodes.

In the semiconductor device of the present disclosure, it is preferred that the semiconductor device of the present disclosure comprises a plurality of memory cells and a plurality of sub-word lines electrically connected to the plurality of memory cells and to the logic circuit, the logic circuit drive the plurality of memory cells via the sub-word line.

In the semiconductor device of the present disclosure, it is preferred that the first transistor includes eleventh and twelfth diffusion regions on both sides of a channel in the first active region, and the second transistor includes twenty-first and twenty-second diffusion regions on both sides of a channel in the second active region.

In the semiconductor device of the present disclosure, it is preferred that the semiconductor device of the present disclosure comprises an address signal line outputting a row address signal that selects a sub-word line in the same row from the plurality of sub-word lines and electrically connected to the first and second gate electrodes.

In the semiconductor device of the present disclosure, it is preferred that the semiconductor device of the present disclosure further comprises a third active region placed in the second region, surrounded by the isolation region, and isolated from the second active region; another gate groove placed in the second region including the third active region and the isolation region, being shallower than the isolation region and isolated from the gate groove; and a third transistor placed in the second region and having a third gate electrode buried in a lower portion of the another gate groove with the third gate electrode overcrossing with the third active region; wherein the logic circuit has the second and third transistors connected in parallel.

In the semiconductor device of the present disclosure, it is preferred that the third transistor includes thirty-first and thirty-second diffusion regions on both sides of a channel in the third active region.

In the semiconductor device of the present disclosure, it is preferred that the semiconductor device of the present disclosure comprises a sub-word line non-selection signal line outputting a signal that deselects a sub-word line in the same column out of the plurality of sub-word lines and electrically connected to the third gate electrode.

In the semiconductor device of the present disclosure, it is preferred that the semiconductor device of the present disclosure comprises a sub-word line selection signal line outputting a column address signal that selects a sub-word line in the same column from the plurality of sub-word lines and electrically connected to the eleventh diffusion region; and a reference potential line supplying a reference potential that sets the plurality of sub-word lines to a low level and electrically connected to each of the twenty-first and thirty-first diffusion regions, wherein all of the twelfth, twenty-second, and thirty-second diffusion regions are electrically connected to corresponding sub-word lines out of the plurality of sub-word lines.

In a fifth aspect of the present invention, a semiconductor device comprises a semiconductor substrate including a first region and a second region that have different conductivity types from each other; an isolation region placed in the first region and the second region, respectively; a first active region placed in the first region and being surrounded by the isolation region; a second active region placed in the second region and being surrounded by the isolation region; a gate groove placed continuously in the first region and the second region including the first and the second active regions and the isolation region; a gate electrode buried in a lower portion of a the gate groove and overcrossing with the first and the second active regions, respectively; and a cap insulating film buried in an upper portion of the gate groove and covering an upper surface of the gate electrode.

In the semiconductor device of the present disclosure, it is preferred that the gate electrode have a circular part formed in a circular shape on the first active region.

In the semiconductor device of the present disclosure, it is preferred that a portion of the circular part be placed on the isolation region.

In the semiconductor device of the present disclosure, it is preferred that the first active region be a plurality of first active regions formed in a band shape in a first direction, and that the gate electrode have a circular part formed in a circular shape on each of the first active regions and be continuously connected to the circular part adjacent in a second direction different from the first direction on the isolation region.

In the semiconductor device of the present disclosure, it is preferred that the first active region have an eleventh diffusion region in a region outside the circular part and have a twelfth diffusion region in a region within the circular part.

In the semiconductor device of the present disclosure, it is preferred that the semiconductor device of the present disclosure comprises a first contact plug electrically connected to the eleventh diffusion region; and a second contact plug electrically connected to the twelfth diffusion region.

In the semiconductor device of the present disclosure, it is preferred that one or both of the first and second contact plugs is/are also disposed on the gate groove and contacting with the cap insulating film.

In the semiconductor device of the present disclosure, it is preferred that the cap insulating film has a portion positioned higher than an upper surface of the eleventh and twelfth diffusion regions, an interlayer insulating film buried in an opening of the cap insulating film is provided, the interlayer insulating film has first and second holes leading to the eleventh and twelfth diffusion regions, respectively, and the first and second contact plugs are buried in the first and second holes, respectively.

In the semiconductor device of the present disclosure, it is preferred that the semiconductor device of the present disclosure comprises the second active region having a twenty-first and twenty-second diffusion regions on both sides of a channel along the gate groove; a third contact plug electrically connected to the twenty-first diffusion region; and a fourth contact plug electrically connected to the twenty-second diffusion region.

In the semiconductor device of the present disclosure, it is preferred that one or both of the third and fourth contact plugs is/are disposed on the gate groove and contacting with the cap insulating film.

In the semiconductor device of the present disclosure, it is preferred that the cap insulating film has a portion positioned higher than an upper surface of the twenty-first and twenty-second diffusion regions, an interlayer insulating film buried in an opening of the cap insulating film is provided, the interlayer insulating film has third and fourth holes leading to the twenty-first and twenty-second diffusion regions, respectively, and the third and fourth contact plugs are buried in the third and fourth holes, respectively.

According to the present disclosure, the transistor pitch can be reduced while ensuring the reliability, both the performance and characteristics of the transistors can be ensured, and the standby current can be reduced by decreasing the leakage current.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned. Further, regarding the numeric values and the ranges of numeric values stated in the present application, it should be understood that intermediate value(s), lower numerical value(s), or small range(s) thereof is regarded as disclosed, even when no specific explanation is provided.

What is claimed is:

1. A semiconductor device comprising:
a semiconductor substrate including first and second regions that have different conductivity types from each other;
a shallow trench isolation region (STI) comprising a shallow trench extending continuously within the first and second regions and being filled with an insulative material;
first and second active regions placed in respective first and second regions and being each surrounded by the STI;
gate groove that extends continuously from the first active region to the second active region, the gate groove being shallower than the shallow trench, the gate groove having regions that overlap the STI;
a gate electrode disposed in the gate groove, the gate electrode being over the insulative material in regions where the gate groove and the STI overlap;
a cap insulating film disposed in an upper portion of the gate groove so as to cover an upper surface of the gate electrode;
first and second transistors placed in respective first and second active regions and sharing the gate electrode; and
a logic circuit including the first and second transistors connected in series.

2. A semiconductor device comprising:
a semiconductor substrate including first and second regions that have different conductivity types from each other;
an isolation region over the first and second regions and having a shallow trench covered by a field insulator;
first and second active regions placed in respective first and second regions and being each surrounded by the isolation region;
a gate electrode disposed in a lower portion of a gate groove that extends continuously from the first active region to the second active region via the isolation region, the gate groove being shallower than the shallow trench, the isolation region extending continuously over an intermediate region between the first and second active regions and extending continuously underneath the gate electrode in a region where the intermediate region and the gate electrode overlap;
a cap insulating film disposed in an upper portion of the gate groove so as to cover an upper surface of the gate electrode;
first and second transistors placed in respective first and second active regions and sharing the gate electrode; and
a logic circuit including the first and second transistors connected in series.

3. The semiconductor device according to claim 2 comprising:
a plurality of memory cells;
a plurality of sub-word lines electrically connected to the plurality of memory cells and to the logic circuit; and
the logic circuit driving the plurality of memory cells via the sub-word line.

4. The semiconductor device according to claim 2, wherein the first transistor includes first and second diffusion regions on both sides of a channel in the first active region, and the second transistor includes third and fourth diffusion regions on both sides of a channel in the second active region.

5. The semiconductor device according to claim 2 comprising an address signal line outputting a row address signal that selects a sub-word line in the same row from the plurality of sub-word lines and electrically connected to the gate electrode.

6. The semiconductor device according to claim 2 further comprising:
a third active region placed in the second region, being surrounded by the isolation region, and isolated from the second active region;
another gate groove placed in the second region including the third active region and the isolation region, being shallower than the isolation region and isolated from the gate groove;
a third transistor placed in the second region and having a second gate electrode buried in a lower portion of the another gate groove; and the logic circuit having the second and third transistors connected in parallel.

7. The semiconductor device according to claim 6, wherein the third transistor includes thirty-first and thirty-second diffusion regions on both sides of a channel in the third active region.

8. The semiconductor device according to claim 6 comprising a sub-word line non-selection signal line outputting a signal that deselects a sub-word line in the same column out of the plurality of sub-word lines and electrically connected to the second gate electrode.

9. The semiconductor device according to claim 8 comprising:
a sub-word line selection signal line outputting a column address signal that selects a sub-word line in the same column from the plurality of sub-word lines and electrically connected to the eleventh diffusion region; and
a reference potential line supplying a reference potential that sets the plurality of sub-word lines to a low level and electrically connected to each of the twenty-first and thirty-first diffusion regions, wherein
all of the twelfth, twenty-second, and thirty-second diffusion regions are electrically connected to corresponding sub-word lines out of the plurality of sub-word lines.

10. A semiconductor device comprising:
a semiconductor substrate including first and second regions having first and second conductivity types, respectively;
a shallow trench isolation (STI) region, a trench of the STI extending in each of the first and second regions and being filled with an insolating material;
first and second active regions placed in respective first and second regions and each surrounded by the isolation material within the STI region;

a gate electrode buried in a lower portion of a gate groove that extends continuously from the first active region to the second active region via the isolation region, the gate electrode being over the isolation material of the STI in regions where the gate groove and STI overlap; and a cap insulating film buried in an upper portion of the gate groove and covering an upper surface of the gate electrode.

11. The semiconductor device according to claim 10, wherein the gate electrode has a circular part formed in a circular shape on the first active region.

12. A semiconductor device comprising:
a semiconductor substrate including first and second regions having first and second conductivity types, respectively;
an isolation region extending in each of the first and second regions;
first and second active regions placed in respective first and second regions and each surrounded by the isolation region;
a gate electrode buried in a lower portion of a gate groove that extends continuously from the first active region to the second active region via the isolation region the gate electrode having a circular part formed in a circular shape on the first active region a portion of the circular part being placed on the isolation region; and
a cap insulating film buried in an upper portion of the gate groove and covering an upper surface of the gate electrode.

13. The semiconductor device according to claim 12, wherein
the first active region is a plurality of first active regions formed in a band shape in a first direction, and
the gate electrode has a circular part formed in a circular shape on each of the first active regions and is continuously connected to the circular part adjacent in a direction different from the first direction on the isolation region.

14. The semiconductor device according to claim 12, wherein the first active region has an eleventh diffusion region in a region outside the circular part and has a twelfth diffusion region in a region within the circular part.

15. The semiconductor device according to claim 14 further comprising first and second contact plugs electrically connected to the eleventh and twelfth diffusion regions, respectively.

16. The semiconductor device according to claim 15, wherein one or both of the first and second contact plugs is/are also disposed on the gate groove and in contact with the cap insulating film.

17. The semiconductor device according to claim 15, wherein the cap insulating film has a portion positioned higher than an upper surface of the eleventh and twelfth diffusion regions,
an interlayer insulating film buried in an opening of the cap insulating film is provided,
the interlayer insulating film has first and second holes leading to the eleventh and twelfth diffusion regions, respectively, and
the first and second contact plugs are buried in the first and second holes, respectively.

18. The semiconductor device according to claim 15 comprising:
the second active region having twenty-first and twenty-second diffusion regions on both sides of a channel along the gate groove; and
third and fourth contact plugs electrically connected to the twenty-first and twenty-second diffusion regions, respectively.

19. The semiconductor device according to claim 18, wherein one or both of the third and fourth contact plugs is/are disposed on the gate groove and in contact with the cap insulating film.

20. The semiconductor device according to claim 18, wherein
the cap insulating film has a portion positioned higher than an upper surface of the twenty-first and twenty-second diffusion regions, an interlayer insulating film buried in an opening of the cap insulating film is provided,
the interlayer insulating film has third and fourth holes leading to the twenty-first and twenty-second diffusion regions, respectively, and the third and fourth contact plugs are buried in the third and fourth holes, respectively.

21. A semiconductor device comprising:
a semiconductor substrate including first and second regions that have different conductivity types from each other;
a shallow trench isolation region (STI) having a trench extending over the first and second regions and being filled with an insulative material; and
a conductive material disposed in a groove that extends continuously over the first and second regions, the groove and the STI having overlapping regions, the insulative material of the STI being beneath the conductive material in the overlapping regions.

22. The semiconductor device according to claim 21, further comprising:
a plurality of memory cells placed in the second region, the conductive material as a sub-word line extending over the plurality of memory cells; and
an additional conductive material connecting to the conductive material over the second region.

* * * * *

UNITED STATES PATENT AND TRADEMARK OFFICE
CERTIFICATE OF CORRECTION

| | | |
|---|---|---|
| PATENT NO. | : 9,437,265 B2 | Page 1 of 1 |
| APPLICATION NO. | : 14/461705 | |
| DATED | : September 6, 2016 | |
| INVENTOR(S) | : Shinya Iwasa and Migaku Kobayashi | |

It is certified that error appears in the above-identified patent and that said Letters Patent is hereby corrected as shown below:

(54) Title – Replace "SEMICONDUCTOR DEVICE HAVING SHALLOW TRENCH ISOLATION AND GATE GROOVE" with --SEMICONDUCTOR DEVICES HAVING SHALLOW TRENCH ISOLATION AND GATE GROOVE--

Column 22, Line 64 – Replace "insolating material" with --insulating material--

Signed and Sealed this
Twelfth Day of September, 2017

Joseph Matal
*Performing the Functions and Duties of the
Under Secretary of Commerce for Intellectual Property and
Director of the United States Patent and Trademark Office*